United States Patent
Zhao et al.

(10) Patent No.: US 11,903,272 B2
(45) Date of Patent: Feb. 13, 2024

(54) DISPLAY SUBSTRATE, DISPLAY PANEL AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Honghao Zhao, Beijing (CN); Wenjun Liao, Beijing (CN); Yanting Lu, Beijing (CN); Taoran Zhang, Beijing (CN); Da Zhou, Beijing (CN); Jianbo Wang, Beijing (CN); Wenjin Huang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 569 days.

(21) Appl. No.: 17/260,659

(22) PCT Filed: Jun. 10, 2020

(86) PCT No.: PCT/CN2020/095445
§ 371 (c)(1),
(2) Date: Jan. 15, 2021

(87) PCT Pub. No.: WO2020/249024
PCT Pub. Date: Dec. 17, 2020

(65) Prior Publication Data
US 2021/0320166 A1 Oct. 14, 2021

(30) Foreign Application Priority Data
Jun. 12, 2019 (CN) .......................... 201910503899.1

(51) Int. Cl.
*H01L 27/32* (2006.01)
*H01L 25/18* (2023.01)
(Continued)

(52) U.S. Cl.
CPC ........... *H10K 59/131* (2023.02); *H01L 25/18* (2013.01); *H10K 59/1213* (2023.02);
(Continued)

(58) Field of Classification Search
CPC ................ H01K 59/131–1315; H01L 27/1255
See application file for complete search history.

(56) References Cited

U.S. PATENT DOCUMENTS

2019/0013339 A1 1/2019 Li et al.
2021/0074213 A1 3/2021 Huang et al.

FOREIGN PATENT DOCUMENTS

CN 1921142 2/2007
CN 109870855 2/2007
(Continued)

OTHER PUBLICATIONS

First Chinese Office Action (w/ English Translation) for corresponding Chinese Application No. 201910503899.1, dated Jul. 30, 2019, 19 pages (previously dated Jun. 29, 2021).
(Continued)

*Primary Examiner* — John A Bodnar
(74) *Attorney, Agent, or Firm* — Dority & Manning, P.A.

(57) ABSTRACT

A display substrate includes a plurality of data lines and a plurality of columns of pixel driving circuits. A column of pixel driving circuits is connected to a corresponding data line, and each pixel driving circuit includes a driving transistor and a first transistor. The driving transistor is a P-type transistor. The first transistor includes: a first active pattern having a first channel region, and a first doped region and a second doped region on two opposite sides of the first
(Continued)

channel region; a first gate; and a first insulating block disposed on a side of the first active pattern away from the base and having a first via. The data line is connected to a portion of the first active pattern located in the first doped region through the first via. Sizes of all first vias in the column of pixel driving circuits gradually decrease in a first direction.

20 Claims, 13 Drawing Sheets

(51) Int. Cl.
    *H10K 59/131* (2023.01)
    *H10K 59/35* (2023.01)
    *H10K 59/121* (2023.01)
    *H01L 27/12* (2006.01)
(52) U.S. Cl.
    CPC ....... *H10K 59/1216* (2023.02); *H10K 59/352* (2023.02); *H01L 27/1255* (2013.01)

(56) References Cited

FOREIGN PATENT DOCUMENTS

| | | |
|---|---|---|
| CN | 105551426 | 5/2016 |
| CN | 108074536 | 5/2018 |
| CN | 207320119 | 5/2018 |
| CN | 108735790 | 11/2018 |
| CN | 109307947 | 2/2019 |
| CN | 109584776 | 4/2019 |
| CN | 10034132 | 7/2019 |

OTHER PUBLICATIONS

First Chinese Office Action (w/ English Translation) for corresponding Chinese Application No. 201910503899.1, dated Jul. 25, 2019, 19 pages.
Second Chinese Office Action (w/ English Translation) for corresponding Chinese Application No. 201910503899.1, dated Aug. 20, 2019, 18 pages.
Notification to Grant Patent (w/ English Translation) for corresponding Chinese Application No. 201910503899.1, dated Sep. 24, 2019, 7 pages.
PCT International Search Report (w/ English translation) for corresponding PCT Application No. PCT/CN2020/095445, dated Aug. 27, 2020, 5 pages.

DISPLAY SUBSTRATE, DISPLAY PANEL AND DISPLAY APPARATUS

CROSS-REFERENCE TO RELATED APPLICATIONS

This application is a national phase entry under 35 USC 371 of International Patent Application No. PCT/CN2020/095445 filed on Jun. 10, 2020, which claims priority to Chinese Patent Application No. 201910503899.1, filed on Jun. 12, 2019, which are incorporated herein by reference in their entirety.

TECHNICAL FIELD

The present disclosure relates to the field of display technologies, and in particular, to a display substrate, a display panel and a display apparatus.

BACKGROUND

With the rapid development of display technology, self-luminous display apparatuses such as organic light-emitting diode (short for OLED) display apparatuses and quantum dot light-emitting diode (short for QLED) display apparatuses have received widespread attention.

SUMMARY

In one aspect, a display substrate is provided. The display substrate includes: a base having a display area; a plurality of data lines disposed on the base and located in the display area; and a plurality of columns of pixel driving circuits disposed on the base and located in the display area. A column of pixel driving circuits in the plurality of columns of pixel driving circuits is connected to a corresponding data line in the plurality of data lines, each pixel driving circuit in the column of pixel driving circuits includes a driving transistor and a first transistor electrically connected to the driving transistor. The driving transistor is a P-type transistor, and the first transistor includes: a first active pattern having a first channel region, and a first doped region and a second doped region that are located on two opposite sides of the first channel region; a first gate, an orthographic projection of the first gate on the base overlapping with an orthographic projection of the first channel region on the base; and a first insulating block disposed on a side of the first active pattern away from the base, the first insulating block being a portion of an insulating layer located in a region where the first transistor is located, and the first insulating block having a first via. The data line is electrically, connected to a portion of the first active pattern located in the first doped region through the first via. Sizes of all first vias in the column of pixel driving circuits gradually decrease in a first direction, and the first direction is a direction in which a signal input terminal of the data line points to a distal end opposite to the signal input terminal.

In some embodiments, the column of pixel driving circuits is divided into a plurality of groups of pixel driving circuits, and each group of pixel driving circuits includes a plurality of pixel driving circuits. Sizes of all first vias in the group of pixel driving circuits are the same, and sizes of first vias in different groups of pixel driving circuits are different.

In some embodiments, the display substrate further includes: a plurality of first voltage lines disposed on the base and located in the display area. The plurality of first voltage lines all extend in the first direction; and the plurality of first voltage lines and the plurality of data lines are disposed in a same layer. The pixel driving circuit further includes a second transistor, and the second transistor includes: a second active pattern having a second channel region, and a third doped region and a fourth doped region that are located on two opposite sides of the second channel region; a portion of the second active pattern located in the fourth doped region and a portion of the first active pattern located in the second doped region being connected as a whole; a second gate, an orthographic projection of the second gate on the base overlapping with an orthographic projection of the second channel region on the base; and a second insulating block, the second insulating block being a portion of the insulating layer located in a region where the second transistor is located, and the second insulating block having a second via. A first voltage line connected to the column of pixel driving circuits is electrically connected to a portion of the second active pattern located in the third doped region through the second via. Sizes of all second vias in the column of pixel driving circuits gradually increase in the first direction.

In some embodiments, the column of pixel driving circuits is divided into a plurality of groups of pixel driving circuits, and each group of pixel driving circuits includes a plurality of pixel driving circuits. Sizes of all second vias in the group of pixel driving circuits are the same, and sizes of second vias in different groups of pixel driving circuits are different.

In some embodiments, the pixel driving circuit further includes a storage capacitor. The storage capacitor includes: a first storage electrode; and a second storage electrode disposed between the first storage electrode and a layer where the plurality of data lines and the plurality of first voltage lines are located. The driving transistor includes: a third active pattern having a third channel region, and a fifth doped region and a sixth doped region that are located on two opposite sides of the third channel region; a portion of the third active pattern located in the fifth doped region and the portion of the first active pattern located in the second doped region being connected as a whole; and a third gate further used as the first storage electrode, an orthographic projection of the third gate on the base overlapping with an orthographic projection of the third channel region on the base. The insulating layer includes a first insulating sub-layer, a second insulating sub-layer, and a third insulating sub-layer that are sequentially stacked. The first insulating sub-layer is located between the third active pattern and the first storage electrode, the second insulating sub-layer is located between the first storage electrode and the second storage electrode, and the third insulating sub-layer is located between the second storage electrode and the layer where the plurality of data lines and the plurality of first voltage lines are located. The first voltage line is electrically connected to the second storage electrode through a third via penetrating the third insulating sub-layer.

In some embodiments, the pixel driving circuit further includes a fourth transistor, the fourth transistor including: a fourth active pattern having a fourth channel region, and a seventh doped region and an eighth doped region that are located on two opposite sides of the fourth channel region; a portion of the fourth active pattern located in the seventh doped region and a portion of the third active pattern located in the sixth doped region being connected as a whole; a fourth gate, an orthographic projection of the fourth gate on the base overlapping with an orthographic projection of the fourth channel region on the base; and a fourth insulating block, the fourth insulating block being a portion of the insulating layer in a region where the fourth transistor is located, and the fourth insulating block having a fourth via. The pixel driving circuit further includes a first auxiliary pattern disposed in a same layer as the plurality of data lines and the plurality of first voltage lines, the first auxiliary pattern being electrically connected to a portion of the fourth active pattern located in the eighth doped region through the fourth via. Sizes of all fourth vias in the column of pixel driving circuits gradually increase in the first direction.

In some embodiments, the column of pixel driving circuits is divided into a plurality of groups of pixel driving circuits, and each group of pixel driving circuits includes a plurality of pixel driving circuits. Sizes of all fourth vias in the group of pixel driving circuits are the same, and sizes of fourth vias in different groups of pixel driving circuits are different.

In some embodiments, the display substrate further includes: a plurality of enable signal lines disposed on the base and located in the display area. The plurality of enable signal lines all extend in a second direction, and the second direction intersects with the first direction. The plurality of enable signal lines and the first storage electrode are disposed in a same layer; each enable signal line is connected to a row of pixel driving circuit in a plurality of rows of pixel driving circuits, and a portion, located in a region where the fourth transistor is located, of an enable signal line connected to the pixel driving circuit and a portion, located in a region where a second transistor is located, of the enable signal line connected to the pixel driving circuit are used as the fourth gate and the second gate, respectively.

In some embodiments, the pixel driving circuit further includes: at least one fifth transistor, each fifth transistor including: a fifth active pattern having a fifth channel region, and a ninth doped region and a tenth doped region that are located on two opposite sides of the fifth channel region; and a fifth gate, an orthographic projection of the fifth gate on the base overlapping with an orthographic projection of the fifth channel region on the base; wherein, a portion of the fifth active pattern in the at least one fifth transistor located in the ninth doped region and a portion of the third active pattern located in the sixth doped region are connected as a whole. The pixel driving circuit further includes a second auxiliary pattern disposed in a same layer as the first auxiliary pattern, the second auxiliary pattern being electrically connected to the first storage electrode through a fifth via penetrating the third insulating sub-layer and the second insulating sub-layer, and being electrically connected to a portion of the fifth active pattern located in the tenth doped region through a sixth via penetrating the insulating layer.

In some embodiments, the display substrate further includes: a plurality of gate lines disposed on the base and located in the display area. The plurality of gate lines all extend in the second direction, and the second direction intersects with the first direction. The plurality of gate lines and a plurality of enable signal lines are disposed in a same layer. Each gate line is connected to one of the plurality of rows of pixel driving circuits, and a portion, located in a region where the first transistor is located, of a gate line connected to the pixel driving circuit and a portion, located in a region where the fifth transistor is located, of the gate line connected to the pixel driving circuit are used as the first gate and the fifth gate, respectively.

In some embodiments, the display substrate further includes: a plurality of initialization signal lines disposed on the base and located in the display area. The plurality of initialization signal lines all extend in the second direction, and the second direction intersects with the first direction. The plurality of initialization signal lines and the second storage electrode are disposed in a same layer Each initialization signal line is connected to one of the plurality of rows of pixel driving circuits. The pixel driving circuit further includes: at least one sixth transistor, each sixth transistor including: a sixth active pattern having a sixth channel region, and an eleventh doped region and a twelfth doped region that are located on two opposite sides of the sixth channel region; and a sixth gate, an orthographic projection of the sixth gate on the base overlapping with an orthographic projection of the sixth channel region on the base; wherein, a portion of the sixth active pattern in the at least one sixth transistor that is located in the twelfth doped region and the portion of the fifth active pattern in the at least one fifth transistor that is located in the tenth doped region are connected as a whole. The pixel driving circuit further includes a third auxiliary pattern disposed in a same layer as the first auxiliary pattern, the third auxiliary pattern being electrically connected to an initialization signal line corresponding to the pixel driving circuit through a seventh via penetrating the third insulating sub-layer, and being electrically connected to a portion of the sixth active pattern in the at least one sixth transistor located in the eleventh doped region through an eighth via penetrating the insulating layer.

In some embodiments, the pixel driving circuit further includes: a seventh transistor, the seventh transistor including: a seventh active pattern having a seventh channel region, and a thirteenth doped region and a fourteenth doped region that are located on two opposite sides of the seventh channel region; a portion of the seventh active pattern located in the fourteenth doped region and a portion of the fourth active pattern located in the eighth doped region being connected as a whole; and a seventh gate, an orthographic projection of the seventh gate on the base overlapping with an orthographic projection of the seventh channel region on the base. The pixel driving circuit further includes a fourth auxiliary pattern disposed in a same layer as the third auxiliary pattern; the fourth auxiliary pattern being electrically connected to a portion of the seventh active pattern located in the thirteenth doped region through a ninth via penetrating the insulating layer, and being electrically connected to an initialization signal line corresponding to a next row of pixel driving circuits adjacent to the pixel driving circuit through a tenth via penetrating the third insulating sub-layer.

In some embodiments, the display substrate further includes: a plurality of reset signal lines disposed on the base and located in the display area. The plurality of reset signal lines all extend in the second direction, and the plurality of reset signal lines and a plurality of gate lines are disposed in a same layer. A portion, located in a region where the sixth transistor is located, of a reset signal line connected to the pixel driving circuit is used as the sixth gate, and a portion, located in a region where the seventh transistor is located, of a reset signal line connected to the next row of pixel driving circuits adjacent to the pixel driving circuit is used as the seventh gate.

In some embodiments, the display substrate further includes: a plurality of light-emitting devices disposed on the base. Each pixel driving circuit is electrically connected to one of the plurality of light-emitting devices, and the pixel driving circuit is configured to drive the light-emitting device to emit light.

In some embodiments, the display substrate further includes: a planarization layer disposed between the pixel driving circuits and the light-emitting devices. The planarization layer has a plurality of eleventh vias. The pixel driving circuit includes a fourth transistor and a first auxiliary pattern; the light-emitting device includes an anode, a light-emitting functional layer, and a cathode that are sequentially stacked in a thickness direction of the base, and the anode of the light-emitting device is electrically connected to the first auxiliary pattern through at least one eleventh via Sizes of all eleventh vias in the column of pixel driving circuits gradually increase in the first direction.

In some embodiments, the column of pixel driving circuits is divided into a plurality of groups of pixel driving circuits, and each group of pixel driving circuits includes a plurality of pixel driving circuits. Sizes of all eleventh vias in the group of pixel driving circuits are the same, and sizes of eleventh vias in different groups of pixel driving circuits are different.

In some embodiments, the display substrate further includes: a pixel defining layer disposed on a side of the anode away from the base. The pixel defining layer has a plurality of openings, and each light-emitting functional layer is disposed in a corresponding opening. Sizes of all openings in the column of pixel driving circuits gradually increase in the first direction.

In some embodiments, the plurality of light-emitting devices include a plurality of red light-emitting devices, a plurality of green light-emitting devices, and a plurality of blue light-emitting devices. Sizes of openings corresponding to light-emitting devices of different colors are different.

In another aspect, a display panel is provided. The display panel includes the above-mentioned display substrate and an encapsulation layer that is disposed on a side of the display substrate.

In yet another aspect, a display apparatus is provided. The display apparatus includes the above-mentioned display panel and a data driver chip disposed on a side of the display panel, and the side where the data driver chip is located is a side where a signal input terminal of the data line in the display panel is located.

In yet another aspect, a display substrate is provided. The display substrate includes: a base having a display area; a plurality of data lines disposed on the base and located in the display area; and a plurality of columns of pixel driving circuits disposed on the base and located in the display area. A column of pixel driving circuits in the plurality of columns of pixel driving circuits is connected to a corresponding data line in the plurality of data lines, each pixel driving circuit in the column of pixel driving circuits includes a driving transistor and a first transistor electrically connected to the driving transistor. The driving transistor is an N-type transistor, and the first transistor includes: a first active pattern having a first channel region, and a first doped region and a second doped region that are located on two opposite sides of the first channel region; a first gate, an orthographic projection of the first gate on the base overlapping with an orthographic projection of the first channel region on the base; and a first insulating block disposed on a side of the first active pattern away from the base, the first insulating block being a portion of an insulating layer located in a region where the first transistor is located, and the first insulating block having a first via. The data line is electrically connected to a portion of the first active pattern located in the first doped region through the first via. Sizes of all first vias in the column of pixel driving circuits gradually increase in a first direction, and the first direction is a direction in which a signal input terminal of the data line points to a distal end opposite to the signal input terminal.

In some embodiments, the column of pixel driving circuits is divided into a plurality of groups of pixel driving circuits, and each group of pixel driving circuits includes a plurality of pixel driving circuits. Sizes of all first vias in the group of pixel driving circuits are the same, and sizes of first vias in different groups of pixel driving circuits are different.

In some embodiments, the display substrate further includes: a plurality of first voltage lines disposed on the base and located in the display area. The plurality of first voltage lines all extend in the first direction; and the plurality of first voltage lines and the plurality of data lines are disposed in a same layer. The pixel driving circuit further includes a second transistor, and the second transistor includes: a second active pattern having a second channel region, and a third doped region and a fourth doped region that are located on two opposite sides of the second channel region; a portion of the second active pattern located in the fourth doped region and a portion of the first active pattern located in the second doped region being connected as a whole; a second gate, an orthographic projection of the second gate on the base overlapping with an orthographic projection of the second channel region on the base; and a second insulating block, the second insulating block being a portion of the insulating layer located in a region where the second transistor is located, and the second insulating block having a second via. A first voltage line connected to the column of pixel driving circuits is electrically connected to a portion of the second active pattern located in the third doped region through the second via. Sizes of all second vias in the column of pixel driving circuits gradually decrease in the first direction.

In some embodiments, the column of pixel driving circuits is divided into a plurality of groups of pixel driving circuits, and each group of pixel driving circuits includes a plurality of pixel driving circuits. Sizes of all second vias in the group of pixel driving circuits are the same, and sizes of second vias in different groups of pixel driving circuits are different.

In some embodiments, the pixel driving circuit further includes a storage capacitor. The storage capacitor includes: a first storage electrode; and a second storage electrode disposed between the first storage electrode and a layer where the plurality of data lines and the plurality of first voltage lines are located. The driving transistor includes: a third active pattern having a third channel region, and a fifth doped region and a sixth doped region that are located on two opposite sides of the third channel region; a portion of the third active pattern located in the fifth doped region and the portion of the first active pattern located in the second doped region being connected as a whole; and a third gate further used as the first storage electrode, an orthographic projection of the third gate on the base overlapping with an orthographic projection of the third channel region on the base. The insulating layer includes a first insulating sub-layer, a second insulating sub-layer, and a third insulating sub-layer that are sequentially stacked. The first insulating sub-layer is located between the third active pattern and the first storage electrode, the second insulating sub-layer is located between the first storage electrode and the second storage electrode, and the third insulating sub-layer is located between the second storage electrode and the layer where the plurality of data lines and the plurality of first voltage lines are located. The first voltage line is electrically connected to the second storage electrode through a third via penetrating the third insulating sub-layer.

In some embodiments, the pixel driving circuit further includes a fourth transistor, the fourth transistor including: a fourth active pattern having a fourth channel region, and a seventh doped region and an eighth doped region that are located on two opposite sides of the fourth channel region; a portion of the fourth active pattern located in the seventh doped region and a portion of the third active pattern located in the sixth doped region being connected as a whole; a fourth gate, an orthographic projection of the fourth gate on the base overlapping with an orthographic projection of the fourth channel region on the base; and a fourth insulating block, the fourth insulating block being a portion of the insulating layer in a region where the fourth transistor is located, and the fourth insulating block having a fourth via. The pixel driving circuit further includes a first auxiliary pattern disposed in a same layer as the plurality of data lines and the plurality of first voltage lines; the first auxiliary pattern being electrically connected to a portion of the fourth active pattern located in the eighth doped region through the fourth via. Sizes of all fourth vias in the column of pixel driving circuits gradually decrease in the first direction.

In some embodiments, the column of pixel driving circuits is divided into a plurality of groups of pixel driving circuits, and each group of pixel driving circuits includes a plurality of pixel driving circuits. Sizes of all fourth vias in the group of pixel driving circuits are the same, and sizes of fourth vias in different groups of pixel driving circuits are different.

In some embodiments, the display substrate further includes: a plurality of enable signal lines disposed on the base and located in the display area. The plurality of enable signal lines all extend in a second direction, and the second direction intersects with the first direction. The plurality of enable signal lines and the first storage electrode are disposed in a same layer; each enable signal line is connected to a row of pixel driving circuit in a plurality of rows of pixel driving circuits, and a portion, located in a region where the fourth transistor is located, of an enable signal line connected to the pixel driving circuit and a portion, located in a region where a second transistor is located, of the enable signal line connected to the pixel driving circuit are used as the fourth gate and the second gate, respectively.

In some embodiments, the pixel driving circuit further includes: at least one fifth transistor, each fifth transistor including: a fifth active pattern having a fifth channel region, and a ninth doped region and a tenth doped region that are located on two opposite sides of the fifth channel region; and a fifth gate, an orthographic projection of the fifth gate on the base overlapping with an orthographic projection of the fifth channel region on the base; wherein, a portion of the fifth active pattern in the at least one fifth transistor located in the ninth doped region and a portion of the third active pattern located in the sixth doped region are connected as a whole. The pixel driving circuit further includes a second auxiliary pattern disposed in a same layer as the first auxiliary pattern, the second auxiliary pattern being electrically connected to the first storage electrode through a fifth via penetrating the third insulating sub-layer and the second insulating sub-layer, and being electrically connected to a portion of the fifth active pattern located in the tenth doped region through a sixth via penetrating the insulating layer.

In some embodiments, the display substrate further includes: a plurality of gate lines disposed on the base and located in the display area. The plurality of gate lines all extend in the second direction, and the second direction intersects with the first direction. The plurality of gate lines and the plurality of enable signal lines are disposed in a same layer. Each gate line is connected to one of the plurality of rows of pixel driving circuits, and a portion, located in a region where the first transistor is located, of a gate line connected to the pixel driving circuit and a portion, located in a region where the fifth transistor is located, of the gate line connected to the pixel driving circuit are used as the first gate and the fifth gate, respectively.

In some embodiments, the display substrate further includes: a plurality of initialization signal lines disposed on the base and located in the display area. The plurality of initialization signal lines all extend in the second direction, and the second direction intersects with the first direction. The plurality of initialization signal lines and the second storage electrode are disposed in a same layer. Each initialization signal line is connected to one of the plurality of rows of pixel driving circuits. The pixel driving circuit further includes: at least one sixth transistor, each sixth transistor including: a sixth active pattern having a sixth channel region, and an eleventh doped region and a twelfth doped region that are located on two opposite sides of the sixth channel region; and a sixth gate, an orthographic projection of the sixth gate on the base overlapping with an orthographic projection of the sixth channel region on the base; wherein, a portion of the sixth active pattern in the at least one sixth transistor that is located in the twelfth doped region and the portion of the fifth active pattern in the at least one fifth transistor that is located in the tenth doped region are connected as a whole. The pixel driving circuit further includes a third auxiliary pattern disposed in a same layer as the first auxiliary pattern, the third auxiliary pattern being electrically connected to an initialization signal line corresponding to the pixel driving circuit through a seventh via penetrating the third insulating sub-layer, and being electrically connected to a portion of the sixth active pattern in the at least one sixth transistor located in the eleventh doped region through an eighth via penetrating the insulating layer.

In some embodiments, the pixel driving circuit further includes: a seventh transistor, the seventh transistor including: a seventh active pattern having a seventh channel region, and a thirteenth doped region and a fourteenth doped region that are located on two opposite sides of the seventh channel region; a portion of the seventh active pattern located in the fourteenth doped region and a portion of the fourth active pattern located in the eighth doped region being connected as a whole; and a seventh gate, an orthographic projection of the seventh gate on the base overlapping with an orthographic projection of the seventh channel region on the base. The pixel driving circuit further includes a fourth auxiliary pattern disposed in the same layer as the third auxiliary pattern; the fourth auxiliary pattern being electrically connected to a portion of the seventh active pattern located in the thirteenth doped region through a ninth via penetrating the insulating layer, and being electrically connected to an initialization signal line corresponding to a next row of pixel driving circuits adjacent to the pixel driving circuit through a tenth via penetrating the third insulating sub-layer.

In some embodiments, the display substrate further includes: a plurality of reset signal lines disposed on the base and located in the display area. The plurality of reset signal lines all extend in the second direction, and the plurality of reset signal lines and a plurality of gate lines are disposed in a same layer. A portion, located in a region where the sixth transistor is located, of a reset signal line connected to the pixel driving circuit is used as the sixth gate, and a portion, located in a region where the seventh transistor is located, of a reset signal line connected to the next row of pixel driving circuits adjacent to the pixel driving circuit is used as the seventh gate.

In some embodiments, the display substrate further includes: a plurality of light-emitting devices disposed on the base. Each pixel driving circuit is electrically connected to one of the plurality of light-emitting devices, and the pixel driving circuit is configured to drive the light-emitting device to emit light.

In some embodiments, the display substrate further includes: a planarization layer disposed between the pixel driving circuits and the light-emitting devices. The planarization layer has a plurality of eleventh vias. The pixel driving circuit includes a fourth transistor and a first auxiliary pattern; the light-emitting device includes an anode, a light-emitting functional layer, and a cathode that are sequentially stacked in a thickness direction of the base, and the anode of the light-emitting device is electrically connected to the first auxiliary pattern through at least one eleventh via. Sizes of all eleventh vias in the column of pixel driving circuits gradually decrease in the first direction.

In some embodiments, the column of pixel driving circuits is divided into a plurality of groups of pixel driving circuits, and each group of pixel driving circuits includes a plurality of pixel driving circuits. Sizes of all eleventh vias in the group of pixel driving circuits are the same, and sizes of eleventh vias in different groups of pixel driving circuits are different.

In some embodiments, the display substrate further includes: a pixel defining layer disposed on a side of the anode away from the base. The pixel defining layer has a plurality of openings, and each light-emitting functional layer is disposed in a corresponding opening. Sizes of all openings in the column of pixel driving circuits gradually decrease in the first direction.

In some embodiments, the plurality of light-emitting devices include a plurality of red light-emitting devices, a plurality of green light-emitting devices, and a plurality of blue light-emitting devices. Sizes of openings corresponding to light-emitting devices of different colors are different.

In another aspect, a display panel is provided. The display panel includes the above-mentioned display substrate and an encapsulation layer that is disposed on a side of the display substrate.

In yet another aspect, a display apparatus is provided. The display apparatus includes the above-mentioned display panel and a data driver chip disposed on a side of the display panel, and the side where the data driver chip is located is a side where a signal input terminal of the data line in the display panel is located.

BRIEF DESCRIPTION OF THE DRAWINGS

In order to describe technical solutions in embodiments of the present disclosure or the prior art more clearly, accompanying drawings to be used in the description of the embodiments or the prior art will be introduced below briefly. Obviously, the accompanying drawings to be described below are merely some embodiments of the present disclosure, and a person of ordinary skill in the art may obtain other drawings according to those drawings without paying any creative effort.

DETAILED DESCRIPTION

Technical solutions in embodiments of the present disclosure will be described clearly and completely in combination with the accompanying drawings in the embodiments of the present disclosure. Obviously, the described embodiments are merely some but not all embodiments of the present disclosure. All other embodiments obtained on a basis of the embodiments of the present disclosure by a person of ordinary skill in the art without paying any creative effort shall be included in the protection scope of the present disclosure.

Terms such as "first", "second" and similar terms used in the description and the claims of the present disclosure are not indicate any order, quantity or importance, and are merely used to distinguish different components. Therefore, features defined as "first" or "second" may explicitly or implicitly include one or more of the features. In the description of the embodiments of the present disclosure, terms "a plurality of" and "the plurality of" each mean two or more unless otherwise specified.

In the description of some embodiments, the term "connected" and its extensions may be used. For example, the term "connected" may be used in the description of some embodiments to indicate that two or more elements are in direct physical contact or electric contact with each other. However, the term "connected" may also mean that two or more components are not in direct contact with each other but still cooperate or interact with each other. The embodiments disclosed herein are not necessarily limited to the content herein.

Some embodiments of the present disclosure provide a display apparatus. The display apparatus may be used as a mobile phone, a tablet computer, a personal digital assistant (PDA), an on-board computer, etc., and the usage of the display apparatus is not specifically limited in the embodiments of the present disclosure.

Figure 1:
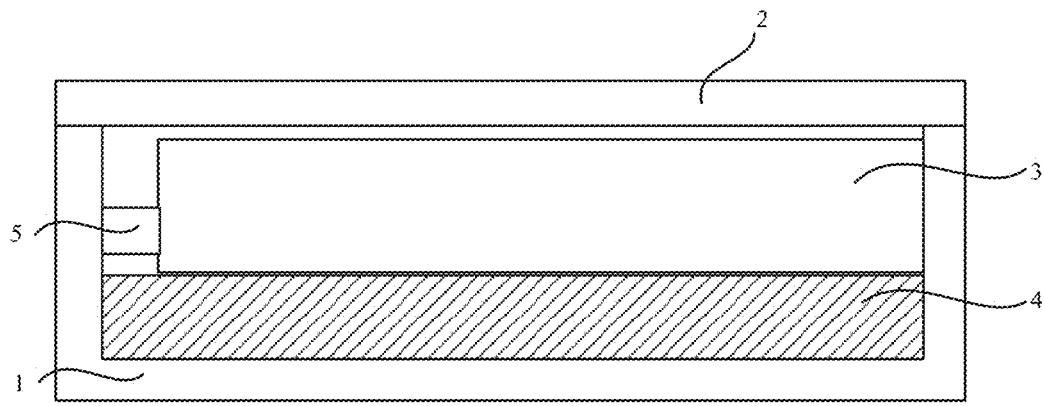
FIG. 1 is a schematic diagram showing a structure of a display apparatus, in accordance with some embodiments of the present disclosure.

The display apparatus may be an organic light-emitting diode (OLED) display apparatus or a quantum dot light-emitting diode (QLED) display apparatus. As shown in FIG. 1, the display apparatus includes a frame 1, a cover plate 2, a display panel 3, a circuit board 4, a flexible circuit board 5, and other electronic accessories such as a camera. For example, the frame 1 is a U-shaped frame, and the display panel 3, the circuit board 4, and the flexible circuit board 5 are disposed in a cavity enclosed by the frame 1 and the cover plate 2. The flexible circuit board 5 is disposed on an edge of the display panel 3. The circuit board 4 is connected to the flexible circuit board 5, and is disposed on a side of the display panel 3 away from the cover plate 2.

In some examples, the flexible circuit board 5 includes a flexible circuit board body and at least one driver chip disposed on the flexible circuit board body, and the driver chip may be a driver integrated circuit (IC). For example, the at least one driver IC includes at least one data driver IC.

In some examples, the circuit board 4 is configured to provide the display panel 3 with signals required for display. For example, the circuit board 4 is a printed circuit board assembly (PCBA), and the PCBA includes a printed circuit board (PCB), and a timing controller (TCON), a power management IC (PMIC), and other ICs or circuits that are disposed on the PCB.

Figure 2:
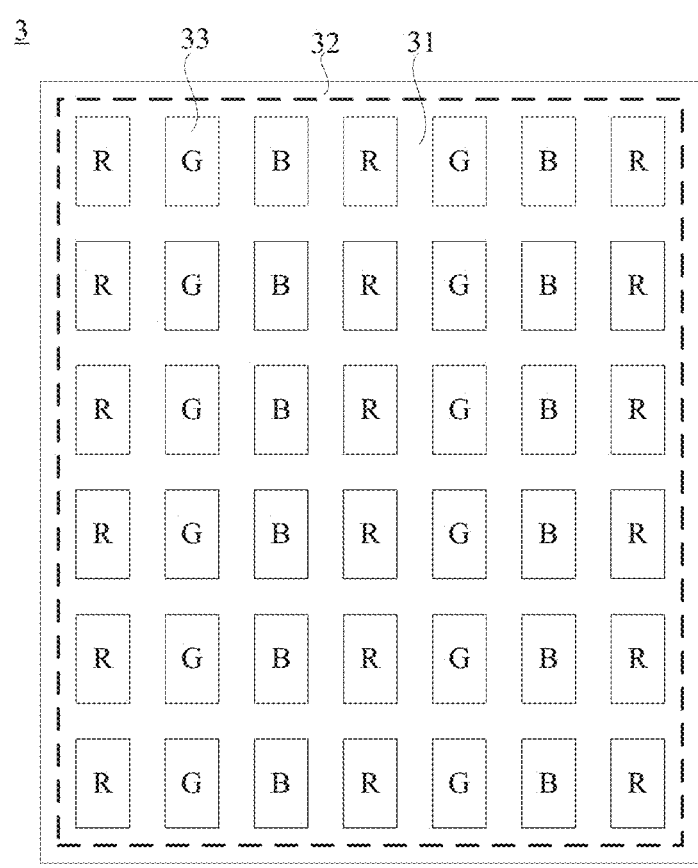
FIG. 2 is a schematic diagram showing region division in a display panel, in accordance with some embodiments of the present disclosure.

As shown in FIG. 2, the display panel 3 has a display area 31 and a peripheral region 32 for wiring. In some examples, the peripheral region 32 is located around the display area 31. In some other examples, the peripheral region 32 is only located on a side of part of edges of the display area 31, such as on two opposite sides of the display area 31. FIG. 2 shows an example in which the peripheral region 32 is located around the display area 31. The display area 31 includes a plurality of sub-pixel regions 33, and the plurality of sub-pixel regions 33 include at least a plurality of red sub-pixel regions, a plurality of green sub-pixel regions, and a plurality of blue sub-pixel regions.

Figure 3:
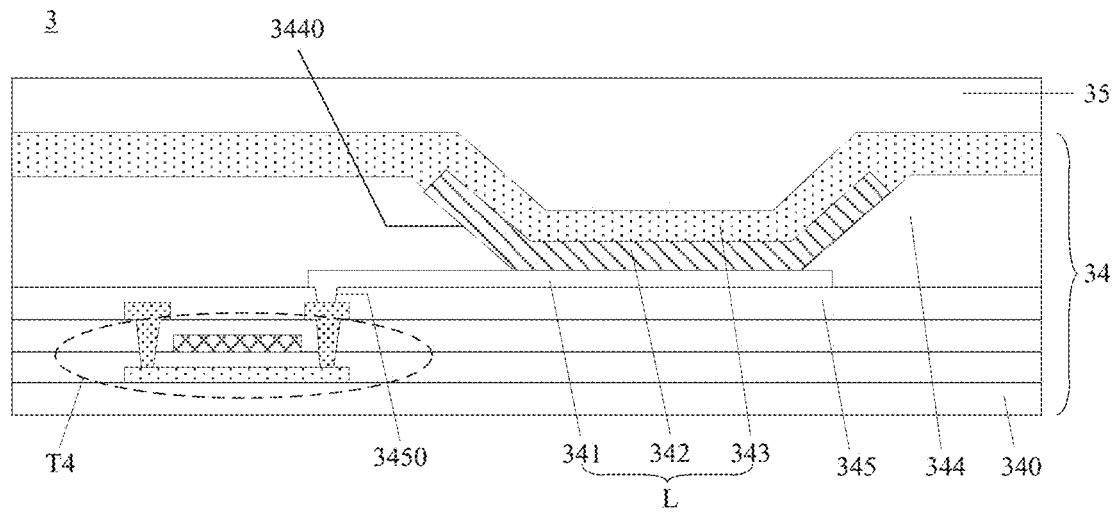
FIG. 3 is a schematic diagram showing a structure of an electroluminescent display panel, in accordance with some embodiments of the present disclosure.

In a case where the display apparatus is an electroluminescent display apparatus (the organic light-emitting diode display apparatus or the quantum dot light-emitting diode display apparatus), the display panel 3 is an electroluminescent display panel. As shown in FIG. 3, the electroluminescent display panel includes a display substrate 34 and an encapsulation layer 35 for encapsulating the display substrate 34. The encapsulation layer 35 may be an encapsulation film or an encapsulation substrate.

Figure 4:
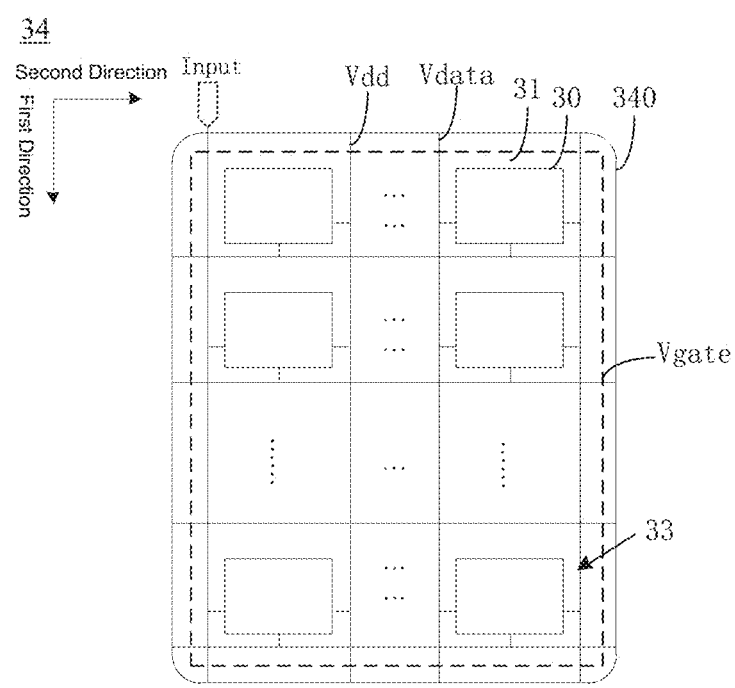
FIG. 4 is a plan view of an electroluminescent display panel, in accordance with some embodiments of the present disclosure.
Figure 5:
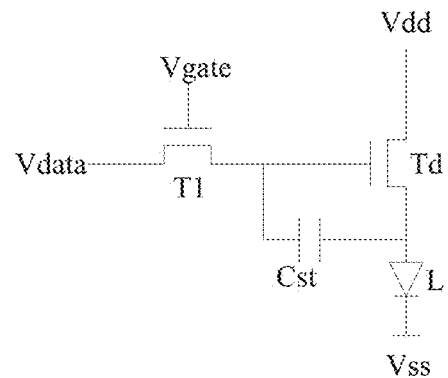
FIG. 5 is a schematic diagram showing a structure of a pixel driving circuit, in accordance with some embodiments of the present disclosure.

Some embodiments of the present disclosure provide a display substrate 34. As shown in FIGS. 4 and 5, the display substrate 34 includes a base 340, and a plurality of pixel driving circuits 30 and a plurality of light-emitting devices L that are disposed on the base 340 and located in the display area 31. Each pixel driving circuit 30 is disposed in a sub-pixel region 33 correspondingly, and each light-emitting device L is disposed in a sub-pixel region 33 correspondingly and electrically connected to a pixel driving circuit 30 located in the sub-pixel region 33. The pixel driving circuit 30 is configured to drive the corresponding light-emitting device L to emit light.

In some examples, a circuit structure of the pixel driving circuit 30 is 2T1C, and its equivalent circuit is as shown in FIG. 5. The pixel driving circuit 30 includes a first transistor T1, a driving transistor Td, and a storage capacitor Cst. A gate of the first transistor T1 is electrically connected to a gate line Vgate, a first electrode of the first transistor T1 is electrically connected to a data line Vdata, and a second electrode of the first transistor T1 is electrically connected to a gate of the driving transistor Td. A first electrode of the driving transistor Td is electrically connected to a first voltage line Vdd, a second electrode of the driving transistor Td is electrically connected to an anode of the light-emitting device L, and a cathode of the light-emitting device L is electrically connected to a second voltage line Vss. A first storage electrode of the storage capacitor Cst is electrically connected to the gate of the driving transistor Td, and a second storage electrode of the storage capacitor Cst is electrically connected to the second electrode of the driving transistor Td. It will be noted that, for each transistor, one of a first electrode and a second electrode is a source, and the other is a drain.

Figure 6:
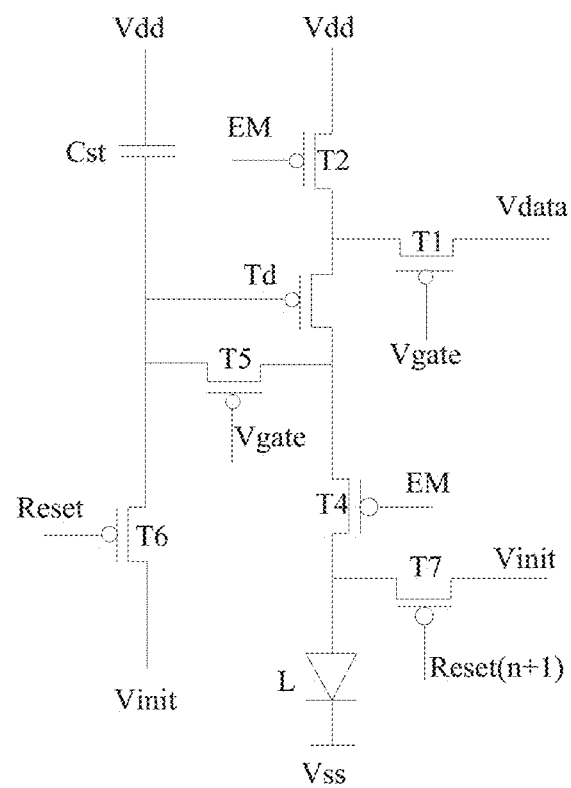
FIG. 6 is a schematic diagram showing a structure of another pixel driving circuit, in accordance with some embodiments of the present disclosure.
Figure 7:
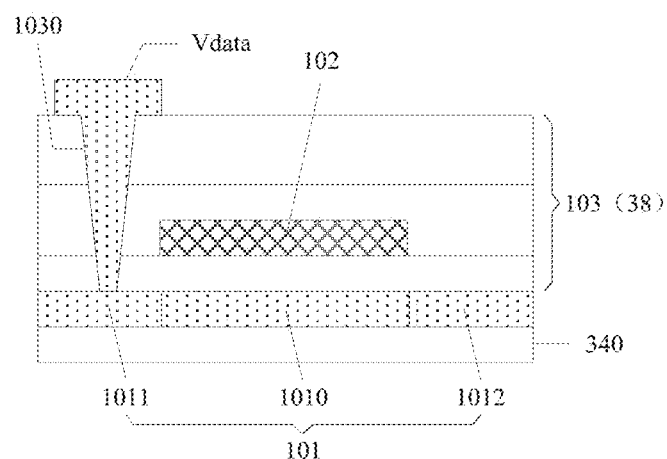
FIG. 7 is a schematic diagram showing a structure of a first transistor, in accordance with some embodiments of the present disclosure.

In some other examples, the circuit structure of the pixel driving circuit 30 is 7T1C, and its equivalent circuit is as shown in FIG. 6. The pixel driving circuit 30 includes a first transistor T1, a second transistor T2, a fourth transistor T4, a fifth transistor T5, a sixth transistor T6, a seventh transistor T7, a driving transistor Td, and a storage capacitor Cst. A gate of the first transistor T1 is electrically connected to the gate line Vgate, a first electrode of the first transistor T1 is electrically connected to the data signal Vdata, and a second electrode of the first transistor T1 is electrically connected to a first electrode of the driving transistor Td. A second electrode of the driving transistor Td is electrically connected to a first electrode of the fourth transistor T4 and a first electrode of the fifth transistor T5, and a gate of the driving transistor Td is electrically connected to a second electrode of the fifth transistor T5. A gate of the fifth transistor T5 is electrically connected to the gate line Vgate. A gate of the fourth transistor T4 is electrically connected to an enable signal line EM, a second electrode of the fourth transistor T4 is electrically connected to the anode of the light-emitting device L, and the cathode of the light-emitting device L is electrically connected to the second voltage line Vss, A gate of the second transistor T2 is electrically connected to the enable signal line EM, a first electrode of the second transistor T2 is electrically connected to the first voltage line Vdd, and a second electrode of the second transistor T2 is electrically connected to the first electrode of the driving transistor Td. A gate of the sixth transistor T6 is electrically connected to a reset signal line Vreset, a first electrode of the sixth transistor T6 is electrically connected to an initialization signal line Vinit, and a second electrode of the sixth transistor T6 is electrically connected to the gate of the driving transistor Td. A gate of the seventh transistor T7 is electrically connected to a reset signal line Vreset connected to a sixth transistor T6 in a pixel driving circuit 30 in a next row, a first electrode of the seventh transistor T7 is electrically connected to the initialization signal line Vinit, and a second electrode of the seventh transistor T7 is electrically connected to the anode of the light-emitting device L. A first storage electrode of the storage capacitor Cst is electrically connected to the first voltage line Vdd, and a second storage electrode of the storage capacitor Cst is electrically connected to the gate of the driving transistor Td.

It will be understood by those skilled in the art that in the pixel driving circuit 30, a width-length ratio of a channel of the driving transistor Td is greater than a width-length ratio of a channel of another transistor functioning as a switch.

The above is merely examples of the pixel driving circuit 30. The equivalent circuit structure of the pixel driving circuit 30 is not limited to the structures shown in FIGS. 5 and 6, and the pixel driving circuits 30 may be other types of pixel driving circuits, which will not be listed herein. However, it can be understood that, regardless of the structure of the pixel driving circuit 30, it includes at least a driving transistor Td, a transistor functioning as a switch, and a storage capacitor Cst. On this basis, the display substrate 3 includes the gate line Vgate, the data line Vdata, and the first voltage line Vdd that are connected to the pixel driving circuit 30.

A layer structure of the display substrate 34 provided in some embodiments of the present disclosure will be described below with reference to the drawings. The driving transistor Td may be a P-type transistor or an N-type transistor. The following description will be given by taking an example in which the driving transistor Td is the P-type transistor.

As shown in FIG. 4, the display substrate 34 includes the base 340, a plurality of gate lines Vgate, a plurality of data lines Vdata, a plurality of first voltage lines Vdd, and a plurality of columns of pixel driving circuits 30 that are disposed on the base 340 and located in the display area 31. The plurality of data lines Vdata and the plurality of first voltage lines Vdd all extend in a first direction, and the plurality of gate lines Vgate extend in a second direction. The first direction and the second direction intersect each other, for example, are perpendicular to each other. The first direction is a direction in which a signal input terminal Input of the data line Vdata points to a distal end opposite to the signal input terminal. The plurality of columns of pixel driving circuits 30 are arranged in the second direction, each column of pixel driving circuits 30 includes a plurality of pixel driving circuits 30 arranged in the first direction, and each pixel driving circuit 30 is located in a corresponding sub-pixel region 33.

For example, the plurality of data lines Vdata and the plurality of first voltage lines Vdd are disposed in a same layer, and the plurality of gate lines Vgate are disposed between a layer where the plurality of data lines Vdata and the plurality of first voltage lines Vdd are located and the base 340. The "same layer" herein refers to that a film for forming specific patterns is formed by using a same film-forming process, and then a patterning process is performed on the film by using a same mask to form a layer structure. The patterning process may include exposure, development and etching processes. The specific patterns in the formed layer structure may be continuous or discontinuous, and these specific patterns may also be at different heights or have different thicknesses.

One of the plurality of columns of pixel driving circuits 30 arranged in the second direction is connected to a corresponding one of the plurality of data lines Vdata. For example, each column of pixel driving circuits 30 is connected to one corresponding data line Vdata.

One of the plurality of columns of pixel driving circuits 30 arranged in the second direction is connected to a corresponding one of the plurality of first voltage lines Vdd. For example, each column of pixel driving circuits 30 is connected to one corresponding first voltage line Vdd. The first voltage line Vdd is configured to provide a first power supply voltage signal to the pixel driving circuit 30, and the first power supply voltage signal is, for example, a high-level signal.

Pixel driving circuits 30 arranged in the second direction in the plurality of columns of pixel driving circuits 30 constitute a row of pixel driving circuits 30. In the first direction, one of the plurality of rows of pixel driving circuits 30 is connected to a corresponding one of the plurality of gate lines Vgate. For example, each row of pixel driving circuits 30 is connected to one corresponding gate line Vgate.

Figure 11:
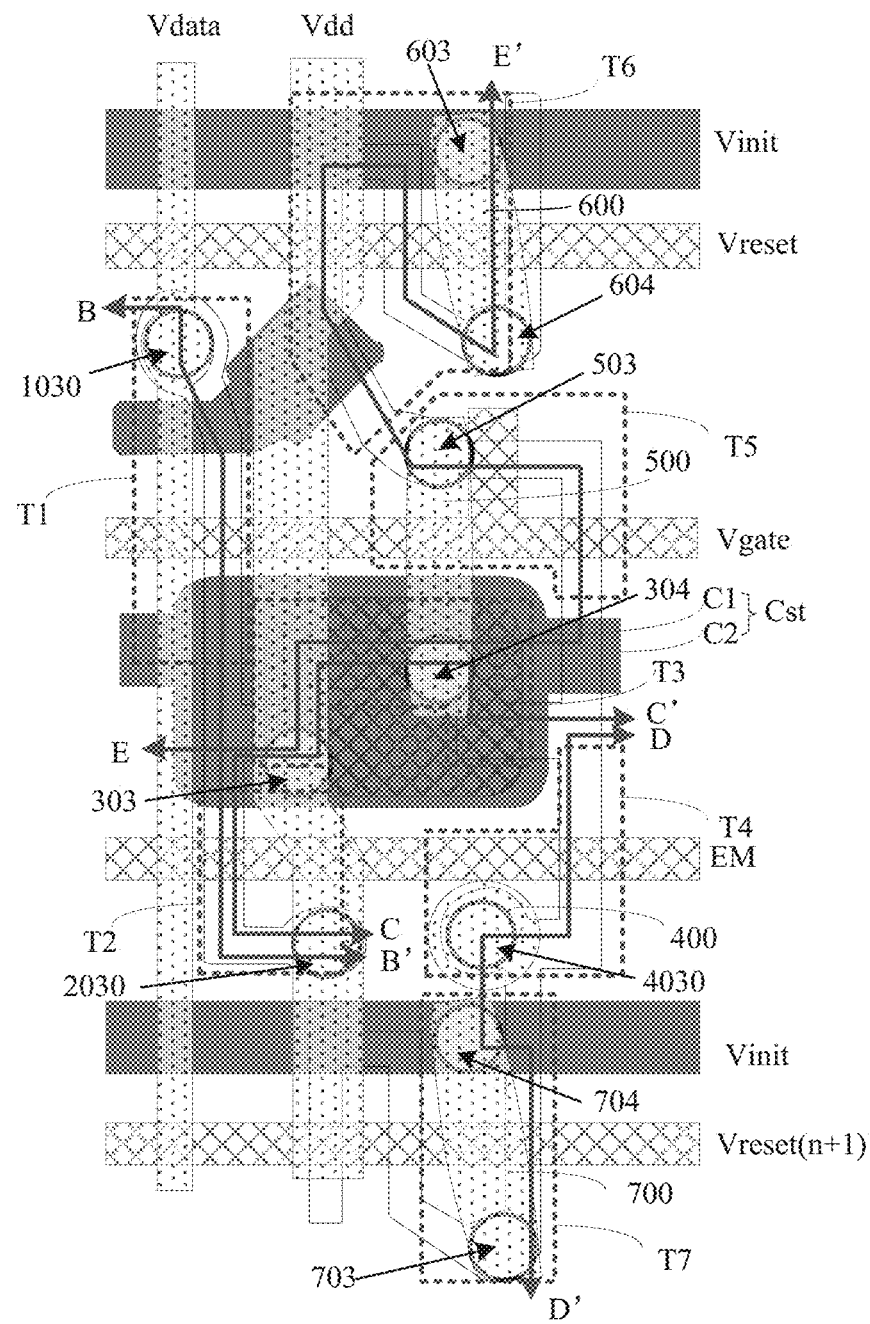
FIG. 11 is a circuit layout diagram corresponding to the pixel driving circuit in FIG. 6, in accordance with some embodiments of the present disclosure.
Figure 12:
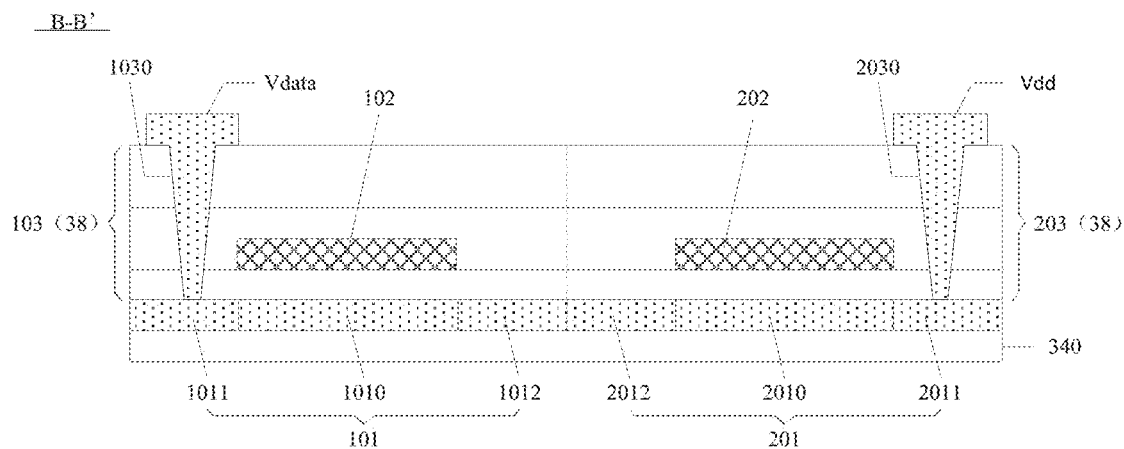
FIG. 12 is a schematic diagram showing structures of a first transistor and a second transistor, in accordance with some embodiments of the present disclosure.

Each pixel driving circuit 30 in the column of pixel driving circuits 30 includes a driving transistor Td and a first transistor T1 electrically connected to the driving transistor Td. For example, the first transistor T1 is a P-type transistor. As shown in FIGS. 11, and 12, the first transistor T1 includes a first active pattern 101, a first gate 102, and a first insulating block 103. The first active pattern 101 has a first channel region 1010, and a first doped region 1011 and a second doped region 1012 that are located on two opposite sides of the first channel region 1010. An orthographic projection of the first gate 102 on the base 340 overlaps with an orthographic projection of the first channel region 1010 on the base 340. For example, a portion, located in a region where the first transistor T1 is located, of the gate line Vgate connected to the pixel driving circuit 30 is used as the first gate 102. The first insulating block 103 is disposed on a side of the first active pattern 101 away from the base 340. The first insulating block 103 has a first via 1030, and the data line Vdata is electrically connected to a portion of the first active pattern 101 located in the first doped region 1011 through the first via 1030. The first insulating block 103 is a portion of an insulating layer 38 located in a region where the first transistor T1 is located. The insulating layer 38 may be composed of a plurality of insulating sub-layers, and the number of the sub-layers needs to be determined based on a structure of the display substrate 34.

It will be noted that, compared to the first channel region 1010, ion doping is performed in the first doped region 1011 and the second doped region 1012, so that portions of the first active pattern 101 located in the first doped region 1011 and the second doped region 1012 are conductors. The subsequent doped regions have a same meaning as the doped regions herein.

Figure 8:
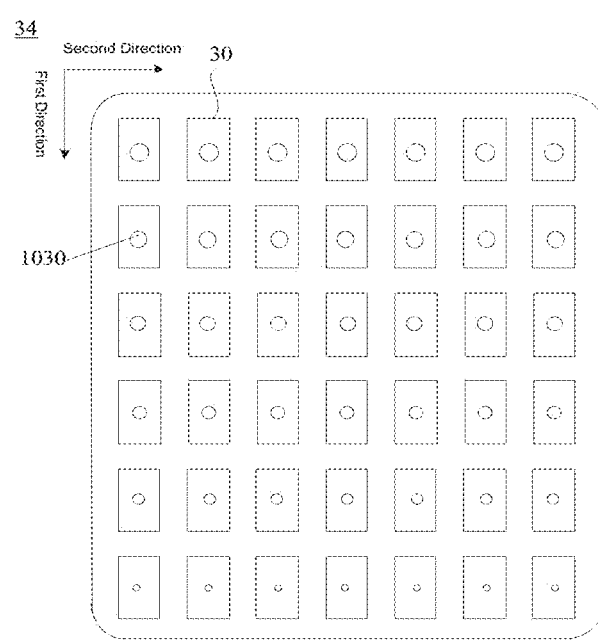
FIG. 8 is a schematic diagram showing a size distribution of first vias, in accordance with some embodiments of the present disclosure.
Figure 9:
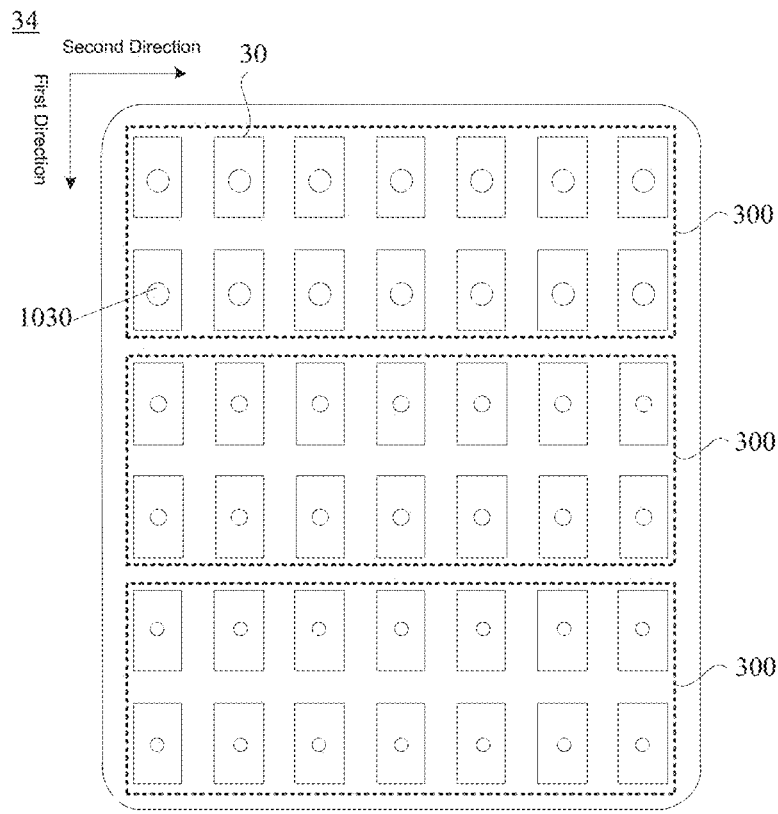
FIG. 9 is a schematic diagram showing another size distribution of first vias, in accordance with some embodiments of the present disclosure.

As shown in FIGS. 8 and 9, in the column of pixel driving circuits 30, sizes of all first vias 1030 gradually decrease in the first direction. FIGS. 8 and 9 only illustrate a structure of the first via 1030 in each sub-pixel region. It will be noted that a "size of a via" mentioned in the embodiments of the present disclosure refers to a size of an orthographic projection of the via on the base 340.

In some examples, as shown in FIG. 8, in the column of pixel driving circuits 30, the sizes of all the first vias 1030 decrease sequentially in the first direction. That is, in the column of pixel driving circuits 30, the sizes of all the first vias 1030 are different.

In some other examples, as shown in FIG. 9, the column of pixel driving circuits 30 is divided into a plurality of groups of pixel driving circuits 300. Each group of pixel driving circuits 300 includes a plurality of pixel driving circuits 30. The number of pixel driving circuits 30 included in different groups of pixel driving circuits 300 may be the same or different. Sizes of first vias 1030 in the group of pixel driving circuits 300 are the same. Sizes of first vias 1030 in different groups of pixel driving circuits 300 are different, that is, in the first direction, sizes of first vias 1030 in the current group of pixel driving circuits 300 decrease relative to those of first vias 1030 in the previous group of pixel driving circuits 300.

Figure 10:
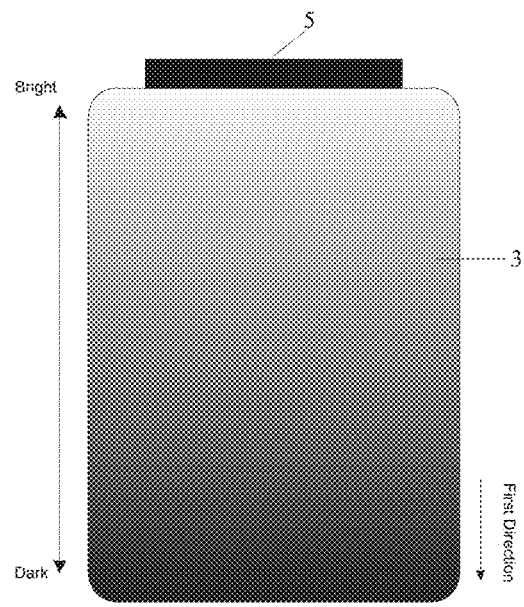
FIG. 10 is a schematic diagram showing long-range brightness unevenness of a display panel in the related art.

The display apparatus may transmit signals to the data line Vdata and the first voltage line Vdd in the display panel through the flexible circuit board 5. As shown in FIG. 10, since the flexible circuit board 5 is disposed on a side of the display panel 3, and the data line Vdata and the first voltage line Vdd both have a certain impedance, the signals on the data line Vdata and the first voltage line Vdd will generate a voltage drop (IR drop) in the first direction.

For a pixel driving circuit 30 including a P-type driving transistor Td, a data signal provided by the data line Vdata will be written into the gate of the driving transistor Td, and the smaller a voltage value of the data signal provided by the data line Vdata, the higher the brightness of the light-emitting device L. The first power supply voltage signal provided by the first voltage line Vdd will be input to the source of the driving transistor Td, and the greater a voltage value of the first power supply voltage signal provided by the first voltage line Vdd, the higher the brightness of the light-emitting device L. Regardless of the voltage drop on the first voltage line Vdd, the voltage drop on the data line Vdata may cause the brightness of the light-emitting devices L to gradually increase in the first direction. However, due to the voltage drop on the first voltage line Vdd, the brightness of the light-emitting devices L will decrease in the first direction. In particular, when the display panel displays a picture with high-grayscales, since the voltage value of the data signal on the data line Vdata is relatively small, an impact of the voltage drop of the data signal on the brightness of the picture is significantly smaller than an impact of the voltage drop of the first power supply voltage signal on the first voltage line Vdd on the brightness of the picture. Therefore, as shown in FIG. 10, in the first direction, the brightness of light-emitting devices L connected to the column of first pixel driving circuits 30 significantly decreases. As a result, the display apparatus has a problem of long-range brightness unevenness.

In the display substrate 34 provided by some embodiments of the present disclosure, in the column of pixel driving circuits 30 connected to the data line Vdata, the sizes of the first vias 1030 for electrically connecting the data line Vdata and the first transistors T1 gradually decrease in the first direction. Regardless of the voltage drop on the data line Vdata, the voltages of the data signals written into the column of pixel driving circuits 30 gradually decrease. On this basis, due to the existence of the voltage drop on the data line Vdata, the voltage value of the data signal on the data line Vdata further decreases in the first direction. In this way, since the smaller the voltage value of the data signal provided by the data line Vdata is, the higher the brightness of the light-emitting device L is, the display brightness of the light-emitting devices L connected to the column of pixel driving circuits 30 may increase in the first direction. Thus, it is possible to improve the problem of brightness reduction of the light-emitting devices L arranged in the first direction, and enhance uniformity of the display brightness.

In some embodiments, as shown in FIG. 11, the display substrate 34 further includes a plurality of enable signal lines EM disposed on the base 340 and located in the display area 31 and the enable signal lines EM extend in the second direction. The plurality of enable signal lines EM and the plurality of gate lines Vgate are disposed in a same layer. The enable signal line EM is configured to provide a turn-on signal during a light-emitting phase.

It will be noted that, FIG. 11 only illustrates layer structures of one pixel driving structure 30 and the signal lines connected thereto.

One of the plurality of rows of pixel driving circuits 30 arranged in the first direction is connected to a corresponding one of the plurality of enable signal lines EM. For example, each row of pixel driving circuits 30 is connected to a corresponding enable signal line EM.

Figure 15:
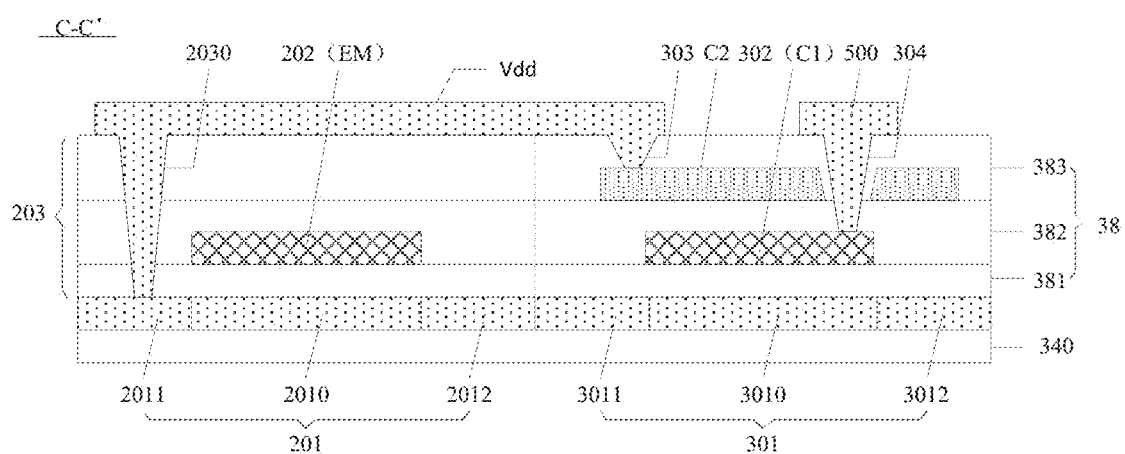
FIG. 15 is a schematic diagram showing structures of a second transistor and a driving transistor, in accordance with some embodiments of the present disclosure.

As shown in FIGS. 11, 12, and 15, the pixel driving circuit 30 further includes a second transistor T2. As shown in FIGS. 12 and 15, the second transistor T2 includes a second active pattern 201, a second gate 202, and a second insulating block 203. The second active pattern 201 has a second channel region 2010, and a third doped region 2011 and a fourth doped region 2012 that are located on two opposite sides of the second channel region 2010. A portion of the second active pattern 201 located in the fourth doped region 2012 and a portion of the first active pattern 101 located in the second doped region 1012 are connected as a whole. An orthographic projection of the second gate 202 on the base 340 overlaps with an orthographic projection of the second channel region 2010 on the base 340. For example, a portion, located in a region where the second transistor T2 is located, of an enable signal line EM connected to the pixel driving circuit 30 is used as the second gate 202. The second insulating block 203 is a portion of the insulating layer 38 in the region where the second transistor T2 is located. The second insulating block 203 has a second via 2030, and the first voltage line Vdd is electrically connected to a portion of the second active pattern 201 located in the third doped region 2011 through the second via 2030.

Since the portion of the second active pattern 201 located in the fourth doped region 2012 and the portion of the first active pattern 101 located in the second doped region 1012 are connected as a whole, the first active pattern 101 and the second active pattern 201 may be formed at the same time, thereby simplifying the manufacturing process of the display substrate 34.

Figure 13:
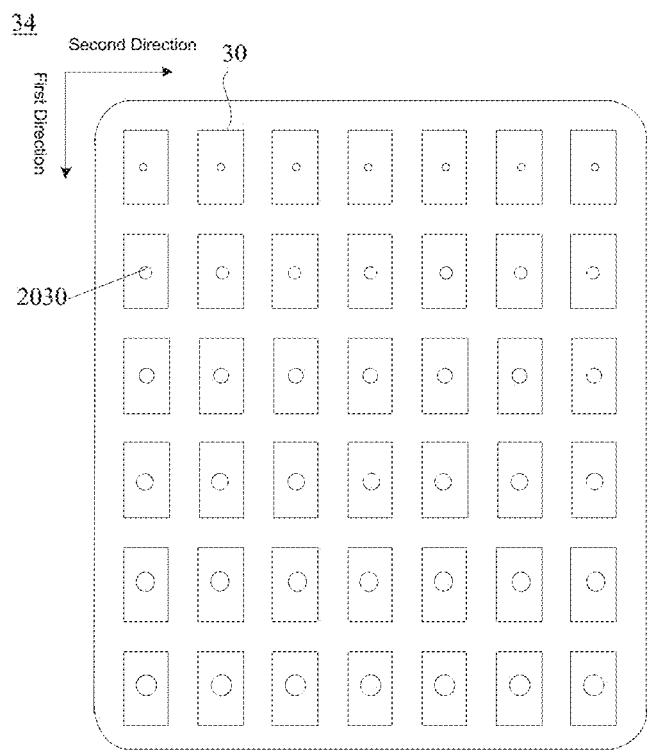
FIG. 13 is a schematic diagram showing a size distribution of second vias, in accordance with some embodiments of the present disclosure.
Figure 14:
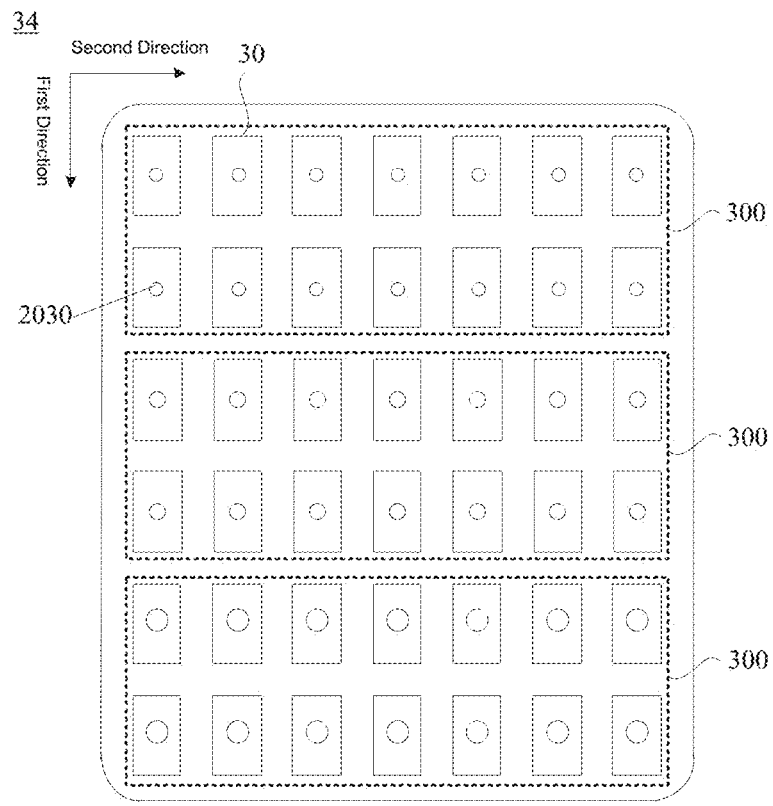
FIG. 14 is a schematic diagram showing another size distribution of second vias, in accordance with some embodiments of the present disclosure.

As shown in FIGS. 13 and 14, in the column of pixel driving circuits 30, sizes of all the second vias 2030 gradually increase in the first direction. FIGS. 13 and 14 only illustrate a structure of the second via 2030 in each sub-pixel region.

In some examples, as shown in FIG. 13, in the column of pixel driving circuits 30, the sizes of all the second vias 2030 increase sequentially in the first direction. That is, in the column of pixel driving circuits 30, the sizes of all the second vias 2030 are different.

In some other examples, as shown in FIG. 14, the column of pixel driving circuits 30 is divided into a plurality of groups of pixel driving circuits 300. Each group of pixel driving circuits 300 includes a plurality of pixel driving circuits 30. The number of pixel driving circuits 30 included in different groups of pixel driving circuits 300 may be the same or different. Sizes of all second vias 2030 in the group of pixel driving circuits 300 are the same. Sizes of second vias 2030 in different groups of pixel driving circuits 300 are different. That is, in the first direction, sizes of second vias 2030 in the current group of pixel driving circuits 300 increase relative to those of second vias 2030 in the previous group of pixel driving circuits 300.

In the display substrate 34 provided by some embodiments of the present disclosure, in the column of pixel driving circuits 30, the sizes of the second vias 2030 for electrically connecting the first voltage line Vdd and the second transistors T2 gradually increase in the first direction. In this way, although the voltage drop on the first voltage line Vdd may cause the voltage value of the first power supply voltage signal on the first voltage line Vdd to gradually decrease in the first direction, the gradual increase in the sizes of the second vias 2030 will cause the voltage value of the first power supply voltage signal transmitted to the column of pixel driving circuits 30 to gradually increase in the first direction, so that the voltage value of the first power supply voltage signal transmitted to the column of pixel driving circuits 30 tends to be balanced. In this way, the problem of long-range brightness unevenness may be further improved, thereby improving the display quality of the display panel 3.

In some embodiments, as shown in FIG. 11, the pixel driving circuit 30 further includes a storage capacitor Cst. As shown in FIGS. 11 and 15, the storage capacitor Cst includes a first storage electrode C1 and a second storage electrode C2, and the second storage electrode C2 is disposed between the first storage electrode C1 and a layer where the plurality of data lines/data and the plurality of first voltage lines Vdd are located. The driving transistor Td includes a third active pattern 301 and a third gate 302. The third active pattern 301 has a third channel region 3010, and a fifth doped region 3011 and a sixth doped region 3012 that are located on two opposite sides of the third channel region 3010. A portion of the third active pattern 301 located in the fifth doped region 3011, the portion of the first active pattern 101 located in the second doped region 1012, and the portion of the second active pattern 201 located in the fourth doped region 2012 are connected as a whole. The third gate 302 is further used as the first storage electrode C1, and an orthographic projection of the third gate 302 on the base 340 overlaps with an orthographic projection of the third channel region 3010 on the base 340.

Since the portion of the third active pattern 301 located in the fifth doped region 3011, the portion of the first active pattern 101 located in the second doped region 1012, and the portion of the second active pattern 201 located in the fourth doped region 2012 are connected as a whole, the first active pattern 101, the second active pattern 201 and the third active pattern 301 may be formed at the same time, thereby simplifying the manufacturing process of the display substrate 34.

As shown in FIG. 15, the insulating layer 38 includes a first insulating sub-layer 381, a second insulating sub-layer 382, and a third insulating sub-layer 383 that are sequentially stacked. The first insulating sub-layer 381 is located between the third active pattern 301 and the first storage electrode C1, the second insulating sub-layer 382 is located between the first storage electrode C1 and the second storage electrode C2, and the third insulating sub-layer 383 is located between the second storage electrode C2 and the layer where the plurality of data lines Vdata and the plurality of first voltage lines Vdd are located. The first voltage line Vdd is electrically connected to the second storage electrode C2 through a third via 303 penetrating the third insulating sub-layer 383.

Figure 16:
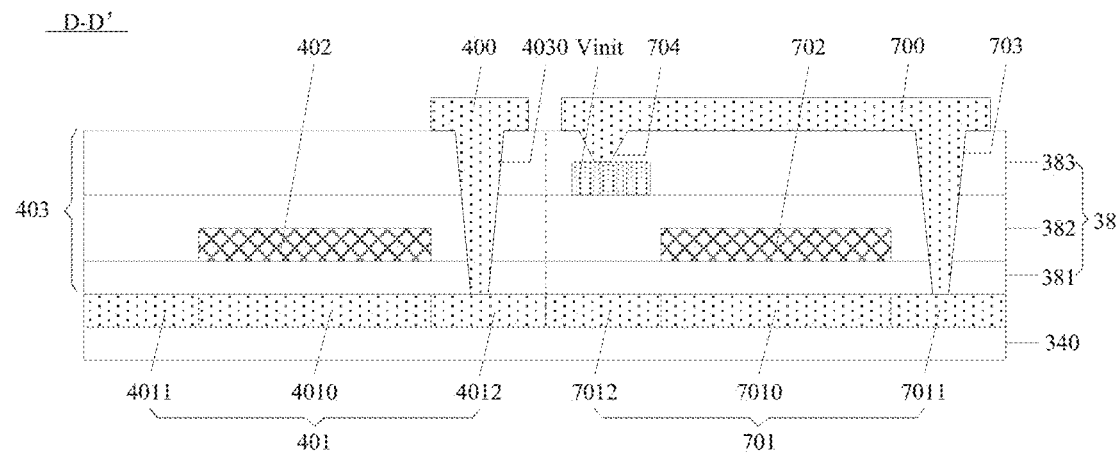
FIG. 16 is a schematic diagram showing structures of a fourth transistor and a seventh transistor, in accordance with some embodiments of the present disclosure.

In some embodiments, as shown in FIG. 11, the pixel driving circuit 30 further includes a fourth transistor T4 and a first auxiliary pattern 400 disposed in a same layer as the plurality of data lines Vdata and the plurality of first voltage lines Vdd. As shown in FIGS. 11 and 16, the fourth transistor T4 includes a fourth active pattern 401, a fourth gate 402, and a fourth insulating block 403. The fourth active pattern 401 has a fourth channel region 4010, and a seventh doped region 4011 and an eighth doped region 4012 that are located on two opposite sides of the fourth channel region 4010. A portion of the fourth active pattern 401 located in the seventh doped region 4011 and a portion of the third active pattern 301 located in the sixth doped region 3012 are connected as a whole. An orthographic projection of the fourth gate 402 on the base 340 overlaps with an orthographic projection of the fourth channel region 4010 on the base 340. For example, a portion, located in a region where the fourth transistor T4 is located, of the enable signal line EM connected to the pixel driving circuit 30 is used as the fourth gate 402. The fourth insulating block 403 is a portion of the insulating layer 38 in the region where the fourth transistor T4 is located. The fourth insulating block 403 has a fourth via 4030, and the first auxiliary pattern 400 is electrically connected to a portion of the fourth active pattern 401 located in the eighth doped region 4012 through the fourth via 4030. Herein, the light-emitting device L can be electrically connected to the portion of the fourth active pattern 401 located in the eighth doped region 4012 through the first auxiliary pattern 400.

Since the portion of the fourth active pattern 401 located in the seventh doped region 4011 and the portion of the third active pattern 301 located in the sixth doped region 3012 are connected as a whole, the third active pattern 301 and the fourth active pattern 401 may be formed at the same time, thereby simplifying the manufacturing process of the display substrate 34.

Figure 17:
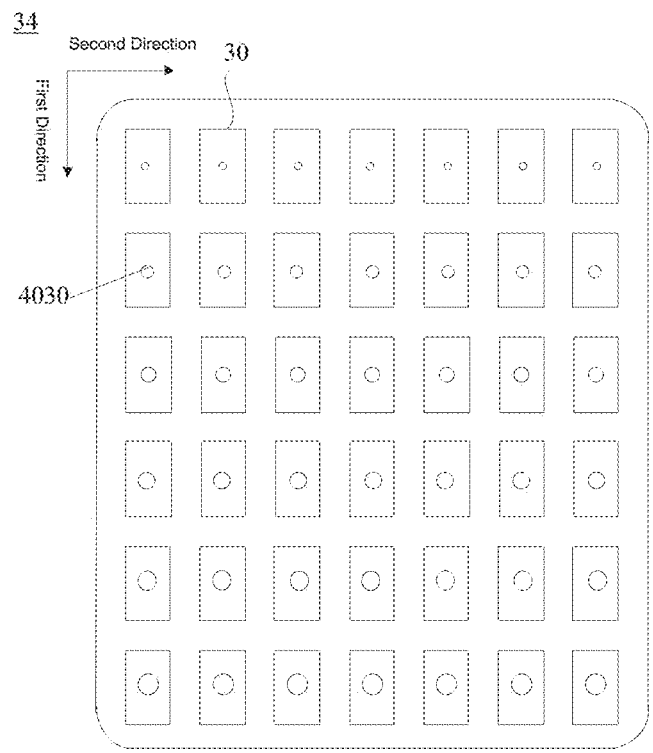
FIG. 17 is a schematic diagram showing a size distribution of fourth vias, in accordance with some embodiments of the present disclosure.
Figure 18:
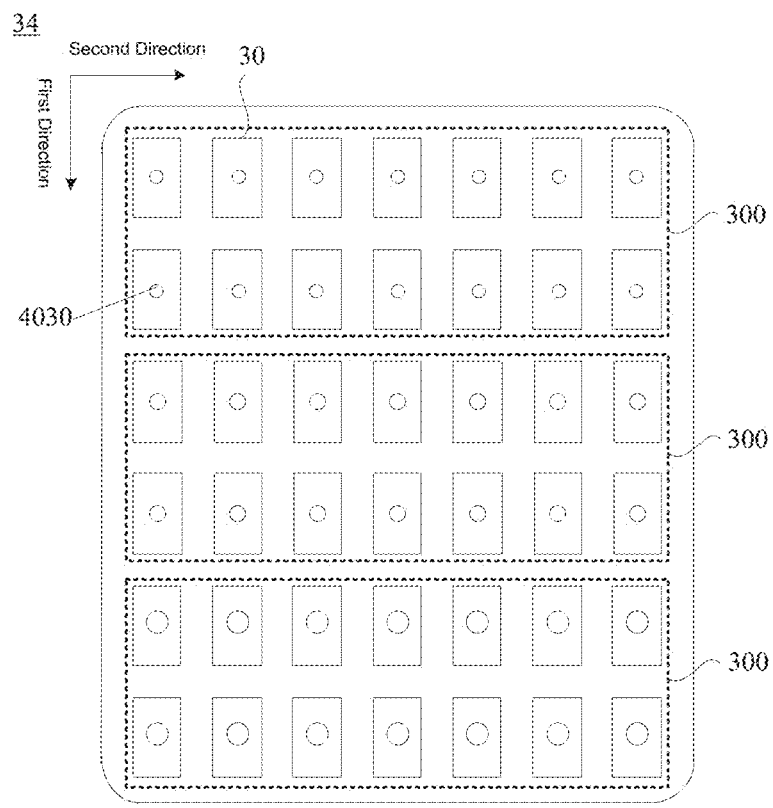
FIG. 18 is a schematic diagram showing another size distribution of forth vias, in accordance with some embodiments of the present disclosure.

As shown in FIGS. 17 and 18, sizes of all fourth vias 4030 in the column of pixel driving circuits 30 gradually increase in the first direction. FIGS. 17 and 18 only illustrate a structure of the fourth via 4030 in each sub-pixel region.

In some examples, as shown in FIG. 17, in the column of pixel driving circuits 30, the sizes of all the fourth vias 4030 increase sequentially in the first direction. That is, in the column of pixel driving circuits 30, the sizes of all the fourth vias 4030 are different.

In some other examples, as shown in FIG. 18, the column of pixel driving circuits 30 is divided into a plurality of groups of pixel driving circuits 300, Each group of pixel driving circuits 300 includes a plurality of pixel driving circuits 30. The number of pixel driving circuits 30 included in different groups of pixel driving circuits 300 may be the same or different. Sizes of fourth vias 4030 in the group of pixel driving circuits 300 are the same. Sizes of fourth vies 4030 in different groups of pixel driving circuits 300 are different. That is, in the first direction, the sizes of the fourth vias 4030 in the current group of pixel driving circuits 300 increase relative to those of the fourth vies 4030 in the previous group of pixel driving circuits 300.

Based on this, for the display substrate 34 provided by some embodiments of the present disclosure, in the column of pixel driving circuits 30, the sizes of the fourth vias 4030 for electrically connecting the light-emitting device L and the pixel driving circuits 30 gradually increase in the first direction. A driving current output by the driving transistor Td will be transmitted to the light-emitting device L through the fourth transistor T4, while the voltage drop on the first voltage line Vdd in the first direction will cause the voltage value of the first power supply voltage signal to gradually decrease, so that the driving current transmitted to the light-emitting device L gradually decreases in the first direction. Therefore, that the sizes of the fourth vias 4030 gradually increase in the first direction may reduce a contact resistance between the fourth transistor T4 and the first auxiliary pattern 400, so that the magnitude of the driving current output to the light-emitting device L tends to be balanced. In this way, the problem of long-range brightness unevenness may be further improved.

Figure 19:
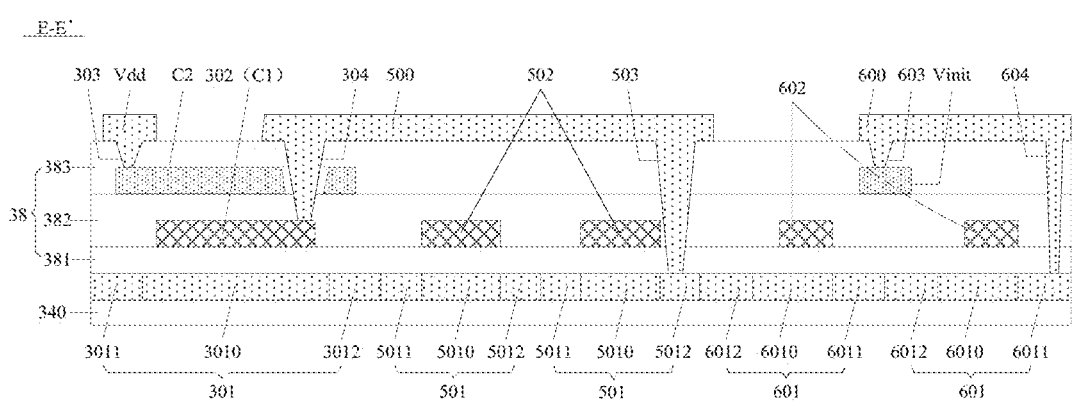
FIG. 19 is a schematic diagram showing structures of a driving transistor, a fifth transistor, and a sixth transistor, in accordance with some embodiments of the present disclosure.

In some embodiments, as shown in FIG. 11, the pixel driving circuit 30 further includes at least one fifth transistor T5 and a second auxiliary pattern 500 that is disposed in a same layer as the first auxiliary pattern 400. As shown in FIG. 19, each fifth transistor T5 includes a fifth active pattern 501 and a fifth gate 502. The fifth active pattern 501 has a fifth channel region 5010, and a ninth doped region 5011 and a tenth doped region 5012 that are located on two opposite sides of the fifth channel region 5010. An orthographic projection of the fifth gate 502 on the base 340 overlaps with an orthographic projection of the fifth channel region 5010 on the base 340. For example, a portion, located in a region where the fifth transistor T5 is located, of the gate line Vgate connected to the pixel driving circuit 30 is used as the fifth gate 502. A portion of the fifth active pattern 501 in the at least one fifth transistor T5 located in the ninth doped region 5011 and a portion of the driving transistor Td located in the sixth doped region 3012 are connected as a whole. The second auxiliary pattern 500 is electrically connected to the first storage electrode C1 through a fifth via 304 penetrating the third insulating sub-layer 383 and the second insulating sub-layer 382, and is electrically connected to a portion of the fifth active pattern 501 located in the tenth doped region 5012 through a sixth via 503 penetrating the insulating layer 38.

In a case where the pixel driving circuit 30 includes a plurality of fifth transistors T5, the plurality of fifth transistors T5 are connected in series, that is, a portion of a fifth active pattern 501 of a first fifth transistor 15 located in the ninth doped region 5011 and the portion of the driving transistor Td located in the sixth doped region 3012 are connected as a whole, and a portion of the fifth active pattern 501 of the first fifth transistor T5 located in the tenth doped region 5012 and a portion of a fifth active pattern 501 of a second fifth transistor T5 located in the ninth doped region 5011 are connected as a whole, and so on. Taking the plurality of fifth transistors T5 including two fifth transistors T5 as an example, since the portion of the fifth active pattern 501 of the first fifth transistor T5 located in the tenth doped region 5012 and the portion of the fifth active pattern 501 of the second fifth transistor T5 located in the ninth doped region 5011 are connected as a whole, the two fifth transistors T5 may be regarded as a fifth equivalent transistor, a portion of a fifth active pattern 501 of the fifth equivalent transistor located in one of its doped regions is the portion of the fifth active pattern 501 of the first fifth transistor T5 located in the ninth doped region 5011, and a portion of the fifth active pattern 501 of the fifth equivalent transistor located in another one of its doped regions is the portion of the fifth active pattern 501 of the second fifth transistor T5 located in the tenth doped region 5012. That the second auxiliary pattern 500 is electrically connected to the portion of the fifth active pattern 501 located in the tenth doped region 5012 through the sixth via 503 penetrating the insulating layer 38 actually means that, the second auxiliary pattern 500 is electrically connected to the portion of the fifth active pattern 501 of the fifth equivalent transistor located in the another one of its doped regions through the sixth via 503 penetrating the insulating layer 38.

Since the fifth active pattern 501 in the fifth transistor T5 and the third active pattern 301 of the driving transistor Td are connected as a whole, the third active pattern 301 and the fifth active pattern 501 may be formed at the same time, so that the manufacturing process of the display substrate 34 may be simplified.

In some embodiments, as shown in FIG. 11, the display substrate 34 further includes a plurality of initialization signal lines Vinit and a plurality of reset signal lines Vreset that are all disposed on the base 340 and located in the display area. The plurality of initialization signal lines Vinit and the plurality of reset signal lines Vreset all extend in the second direction, the plurality of reset signal lines Vreset are disposed in a same layer as the plurality of gate lines Vgate, and the plurality of initialization signal lines Vinit are disposed in a same layer as the second storage electrode C2. The initialization signal line Vinit is configured to provide an initialization signal, and the reset signal line Vreset is configured to provide a reset signal.

As shown in FIG. 11, the pixel driving circuit 30 further includes at least one sixth transistor T6 and a third auxiliary pattern 600 that is disposed in a same layer as the first auxiliary pattern 400. As shown in FIG. 19, each sixth transistor T6 includes a sixth active pattern 601 and a sixth gate 602. The sixth active pattern 601 has a sixth channel region 6010, and an eleventh doped region 6011 and a twelfth doped region 6012 that are located on two opposite sides of the sixth channel region 6010. An orthographic projection of the sixth gate 602 on the base 340 overlaps with an orthographic projection of the sixth channel region 6010 on the base 340. For example, a portion, located in a region where the sixth transistor T6 is located, of a reset signal line Vreset connected to the pixel driving circuit 30 is used as the sixth gate 602. A portion of the sixth active pattern 601 in the at least one sixth transistor T6 located in the twelfth doped region 6012 and the portion of the fifth active pattern 501 in the at least one fifth transistor T5 located in the tenth doped region 5012 are connected as a whole. The third auxiliary pattern 600 is electrically connected to an initialization signal line Vinit connected to the pixel driving circuit 30 through a seventh via 603 penetrating the third insulating sub-layer 383, and is electrically connected to a portion of the sixth active pattern in the at least one sixth transistor T6 located in the eleventh doped region 6011 through an eighth via 604 penetrating the insulating layer 38, so as to realize the electrical connection between the sixth transistor T6 and the initialization signal line Vinit.

In a case where the pixel driving circuit 30 includes a plurality of sixth transistors T6, the plurality of sixth transistors T6 are connected in series, that is, a portion of a sixth active pattern 601 of a first sixth transistor T6 located in the twelfth doped region 6012 and a portion of a sixth active pattern 601 of a second sixth transistor T6 located in the eleventh doped region 6011 are connected as a whole, and by analogy, a portion of a sixth active pattern 601 of a last sixth transistor T6 located in the twelfth doped region 6012 and a portion of a fifth active pattern 501 of a last one of the at least one fifth transistor T5 located in the tenth doped region 5012 are connected as a whole. Taking the plurality of sixth transistors T6 including two sixth transistors T6 as an example, since the portion of the sixth active pattern 601 of the first sixth transistor 16 located in the twelfth doped region 6012 and the portion of the sixth active pattern 601 of the second sixth transistor 16 located in the eleventh doped region 6011 are connected as a whole, the two sixth transistors T6 may be regarded as a sixth equivalent transistor. A portion of a sixth active pattern 601 of the sixth equivalent transistor located in one of its doped regions is the portion of the sixth active pattern 601 of the first sixth transistor T6 located in the eleventh doped region 6011, and a portion of the sixth active pattern 601 of the sixth equivalent transistor located in another one of its doped regions is the portion of the sixth active pattern 601 of the second sixth transistor T6 located in the twelfth doped region 6012. That the third auxiliary pattern 600 is electrically connected to the portion of the sixth active pattern 601 of the at least one sixth transistor T6 located in the eleventh doped region 6011 through the eighth via 604 penetrating the insulating layer 38 actually means that, the third auxiliary pattern 600 is electrically connected to the portion of the sixth active pattern 601 of the sixth equivalent transistor located in the one of its doped regions through the eighth via 604 penetrating the insulating layer 38.

In some embodiments, as shown in FIG. 11, the pixel driving circuit 30 further includes a seventh transistor T7 and a fourth auxiliary pattern 700 that is disposed in a same layer as the third auxiliary pattern 600, As shown in FIG. 16, the seventh transistor T7 includes a seventh active pattern 701 and a seventh gate 702. The seventh active pattern 701 has a seventh channel region 7010, and a thirteenth doped region 7011 and a fourteenth doped region 7012 that are located on two opposite sides of the seventh channel region 7010. A portion of the seventh active pattern 701 located in the fourteenth doped region 7012 and the portion of the fourth active pattern 401 located in the eighth doped region 4012 are connected as a whole. An orthographic projection of the seventh gate 702 on the base 340 overlaps with an orthographic projection of the seventh channel region 7010 on the base 340. For example, a portion, located in a region where the seventh transistor T7 is located, of a reset signal line Vreset) corresponding to a next row of pixel driving circuits 30 adjacent to the pixel driving circuit 30 is used as the seventh gate 702. The fourth auxiliary pattern 700 is electrically connected to a portion of the seventh active pattern 701 located in the thirteenth doped region 7011 through a ninth via 703 penetrating the insulating layer 38, and is electrically connected to an initialization signal line Vinit connected to the next row of pixel driving circuits 30 adjacent to the pixel driving circuit 30 through a tenth via 704 penetrating the third insulating sub-layer 383.

Since the portion of the seventh active pattern 701 located in the fourteenth doped region 7012 and the portion of the fourth active pattern 401 located in the eighth doped region 4012 are connected as a whole, the fourth active pattern 401 and the seventh active pattern 701 may be formed at the same time, thereby simplifying the manufacturing process of the display substrate 34. In some examples, the first transistor T1, the second transistor T2, the fourth transistor T4, the fifth transistor T5, the sixth transistor T6, and the seventh transistor T7 are all P-type transistors.

In some embodiments, as shown in FIG. 3, the light-emitting device L includes an anode 341, a light-emitting functional layer 342, and a cathode 343 that are sequentially stacked in a thickness direction of the base 340. In some examples, the display panel 3 is a top-emission display panel. In this case, the anode 341 of the light-emitting device L is an opaque electrode, and the cathode 343 of the light-emitting device L is a transparent electrode or a translucent electrode. In some other examples, the display panel 3 is a bottom-emission display panel. In this case, the anode 341 of the light-emitting device L is a transparent electrode or a translucent electrode, and the cathode 343 of the light-emitting device L is an opaque electrode. Of course, the display panel 3 may also be a double-sided emission display panel. In this case, both the anode 341 and the cathode 343 of the light-emitting device L are transparent electrodes or translucent electrodes.

In some examples, the light-emitting functional layer 342 includes a light-emitting layer. In some other examples, in addition to the light-emitting layer, the light-emitting functional layer 342 further includes one or more of an election transporting layer (short for ETL), an election injection layer (short for EIL), a hole transporting layer (short for HTL) and a hole injection layer (short for HIL). In a case where the display panel 3 is the organic light-emitting diode display panel, the light-emitting layer is an organic light-emitting layer. In a case where the display panel 3 is a quantum dot light-emitting diode display panel, the light-emitting layer is a quantum dot light-emitting layer.

Figure 20:
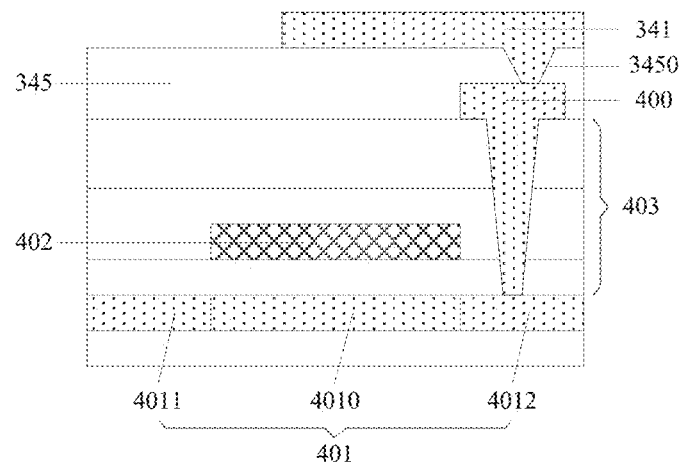
FIG. 20 is a schematic diagram showing structures of a fourth transistor and an anode of a light-emitting device, in accordance with some embodiments of the present disclosure.

In some embodiments, as shown in FIG. 3, the display substrate 34 further includes a planarization layer 345 disposed between the pixel driving circuit 30 and the light-emitting device L, and the planarization layer 345 has a plurality of eleventh vias 3450. As shown in FIGS. 16 and 20, the light-emitting device L is electrically connected to the fourth transistor T4 of the pixel driving circuit 30 through the first auxiliary pattern 400. The anode 341 of the light-emitting device L is electrically connected to the first auxiliary pattern 400 through at least one eleventh via 3450, that is, the anode 341 of the light-emitting device L is electrically connected to the first auxiliary pattern 400 through at least one eleventh via 3450 in the planarization layer 345.

Figure 21:
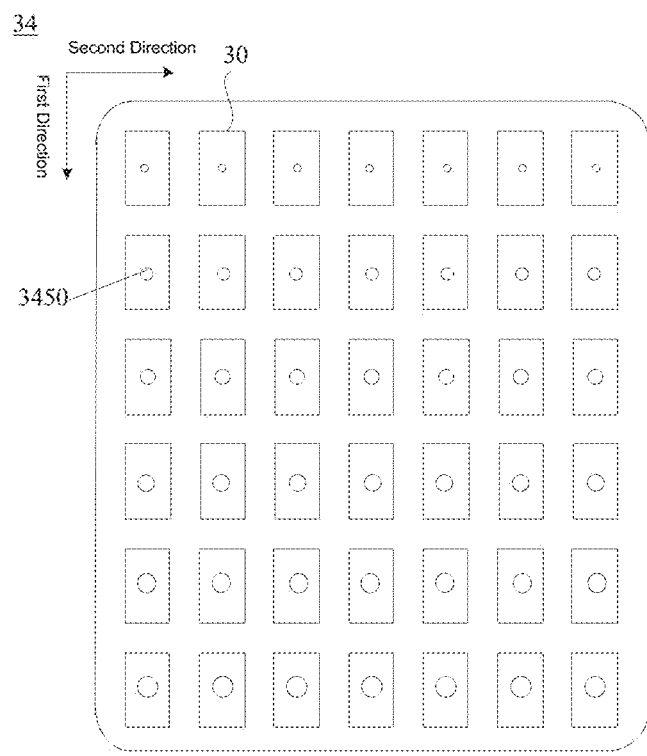
FIG. 21 is a schematic diagram showing a size distribution of eleventh vias, in accordance with some embodiments of the present disclosure.
Figure 22:
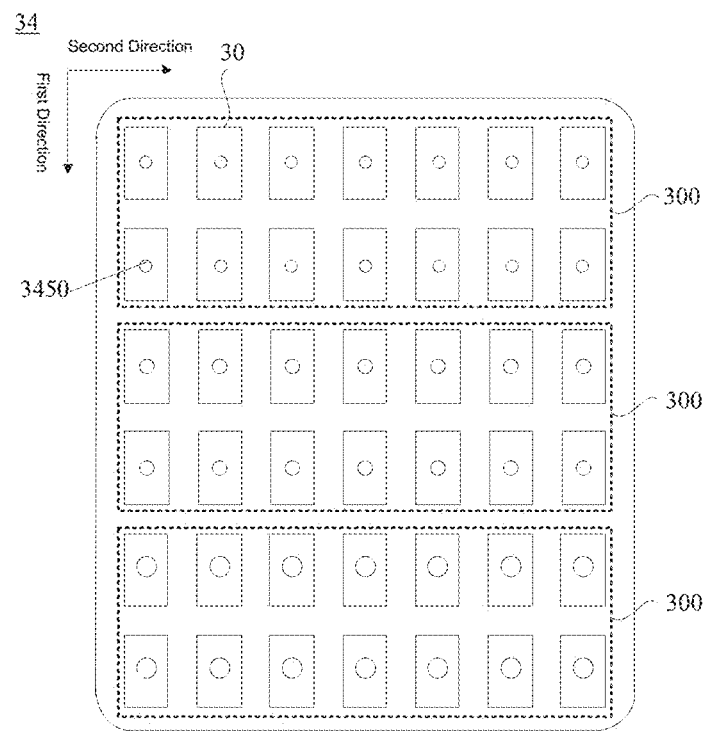
FIG. 22 is a schematic diagram showing another size distribution of eleventh vias, in accordance with some embodiments of the present disclosure.

As shown in FIGS. 21 and 22, sizes of all eleventh vias 3450 in the column of pixel driving circuits 30 gradually increase in the first direction. FIGS. 21 and 22 only illustrate a structure of the eleventh via 3450 in each sub-pixel region.

In some examples, as shown in FIG. 21, in the column of pixel driving circuits 30, the sizes of all the eleventh vias 3450 increase sequentially in the first direction. That is, in the column of pixel driving circuits 30, the sizes of all the eleventh vias 3450 are different.

In some other examples, as shown in FIG. 22, the column of pixel driving circuits 30 is divided into a plurality of groups of pixel driving circuits 300. Each group of pixel driving circuits 300 includes a plurality of pixel driving circuits 30. The number of pixel driving circuits 30 included in different groups of pixel driving circuits 300 may be the same or different. Sizes of eleventh vias 3450 in the group of pixel driving circuits 300 are the same. Sizes of eleventh vias 3450 in different groups of pixel driving circuits 300 are different. That is, in the first direction, the sizes of the eleventh vias 3450 in the current group of pixel driving circuits 300 increase relative to those of the eleventh vias 3450 in the previous croup of pixel driving circuits 300.

For the display substrate 34 provided by some embodiments of the present disclosure, in the column of pixel driving circuits 30, the sizes of the eleventh vias 3450 used to achieve the electrical connection between the anodes 341 of the light-emitting devices L and the first auxiliary patterns 400 gradually increase in the first direction. Since the voltage drop on the first voltage line Vdd causes the driving currents output by the driving transistors Td to gradually decrease in the first direction, gradual increase in the sizes of the eleventh vies 3450 in the first direction may reduce a contact resistance between the first auxiliary pattern 400 and the anode 341 of the light-emitting device L, so that the magnitude of the driving currents transmitted to the light-emitting devices L tends to be balanced. In this way, the problem of long-range brightness unevenness may be further improved.

In some embodiments, as shown in FIG. 3, the display substrate 34 further includes a pixel defining layer 344 disposed on a side of the anode 341 away from the base 340. The pixel defining layer 344 has a plurality of openings 3440. Each light-emitting functional layer 342 is disposed in a corresponding opening 3440. It will be noted that, since only one light-emitting device L is illustrated in FIG. 3, only one opening 3440 in the pixel defining layer 344 is illustrated in FIG. 3.

For example, the plurality of light-emitting devices L include a plurality of red light-emitting devices, a plurality of green light-emitting devices, and a plurality of blue light-emitting devices. Sizes of openings corresponding to light-emitting devices of different colors are different. Since luminous efficiencies of the blue light-emitting devices, the red light-emitting devices, and the green light-emitting devices increase sequentially, for a same pixel region (including a red sub-pixel region, a green sub-pixel region, and a blue sub-pixel region), sizes of the openings 3440 corresponding to the blue light-emitting device, the red light-emitting device, and the green light-emitting device decrease sequentially.

Here, "a size of an opening 3440" refers to a size of an orthographic projection of an opening on the base 340.

Figure 23:
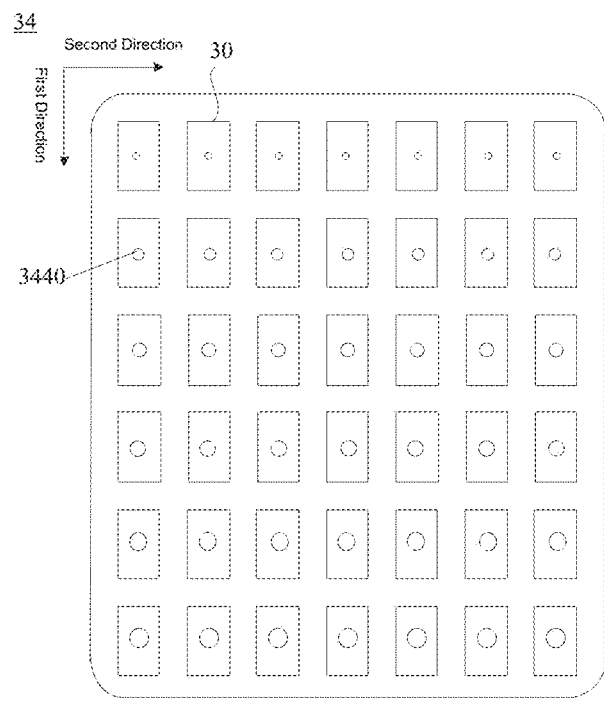
FIG. 23 is a schematic diagram showing a size distribution of openings, in accordance with some embodiments of the present disclosure.
Figure 24:
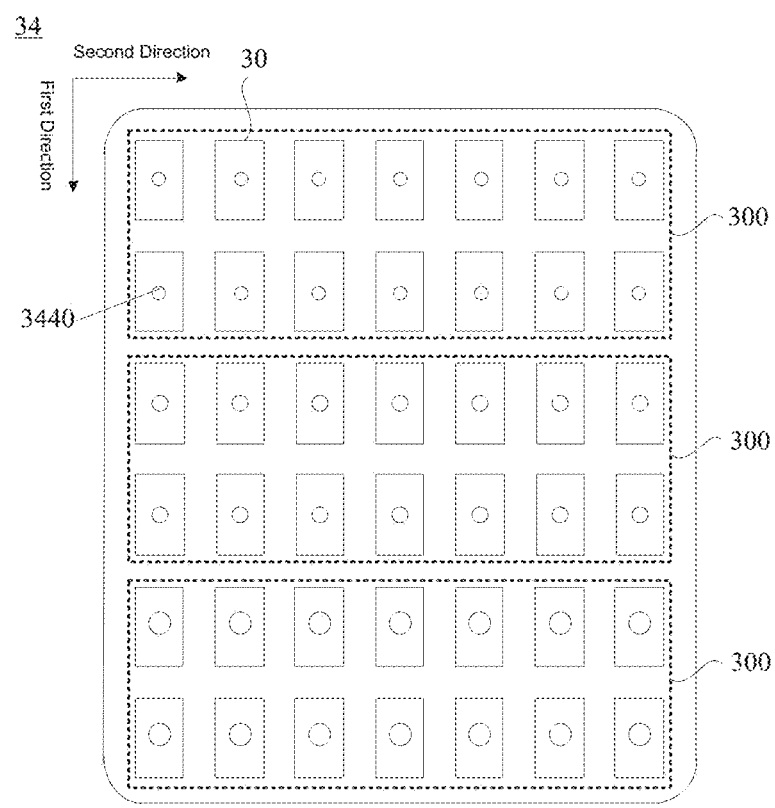
FIG. 24 is a schematic diagram showing anther size distribution of openings, in accordance with some embodiments of the present disclosure.

For different pixel regions, as shown in FIGS. 23 and 24, sizes of all openings 3440 corresponding to a column of pixel driving circuits 30 connected to a data line Vdata gradually increase in the first direction. FIGS. 23 and 24 only illustrate a structure of an opening 3440 in each sub-pixel region.

In some examples, as shown in FIG. 23, in the column of pixel driving circuits 30, the sizes of all the openings 3440 increase sequentially in the first direction. That is, in the column of pixel driving circuits 30, the sizes of all the openings 3440 are different.

In some other examples, as shown in FIG. 24, the column of pixel driving circuits 30 is divided into a plurality of groups of pixel driving circuits 300. Each group of pixel driving circuits 300 includes a plurality of pixel driving circuits 30. The number of pixel driving circuits 30 included in different groups of pixel driving circuits 300 may be the same or different. Sizes of openings 3440 in the group of pixel driving circuits 300 are the same. Sizes of openings 3440 in different groups of pixel driving circuits 300 are different. That is, in the first direction, the sizes of the openings 3440 in the current group of pixel driving circuits 300 increase relative to those of the openings 3440 in the previous group of pixel driving circuits 300.

It will be understood that, the sizes of the openings 3440 are not the same, so that sizes of the light-emitting functional layers 342 disposed in the openings 3440 are different. The larger the size of the light-emitting functional layer 342, the greater the brightness of the light emitted from a region of the opening 3440.

Since the sizes of the plurality of openings 3440 are not completely the same, the brightness of the light emitted from the regions of the plurality of openings 3440 is not completely the same. The sizes of the openings 3440 are designed according to the luminous efficiencies of the light-emitting devices L of different colors and a voltage drop phenomenon of the signal line, so that it is possible to solve problems of color difference or color unevenness (discolor) caused by both difference in efficiencies of different colors and long-range brightness unevenness.

Based on the above description, some embodiments of the present disclosure further provide another display substrate. The difference from the above display substrate lies in that the driving transistor Td is an N-type transistor, and in the first direction, the change trends of the sizes of the first vias 1030, the second vias 2030, the fourth vias 4030, the eleventh vias 3450 and the openings 3440 are opposite to the change trends in a case where the driving transistor Td is a P-type transistor, and details will not be repeated here.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure, Therefore, the protection scope of the present disclosure shall be subject to the protection scope of the claims.

What is claimed is:

1. A display substrate, comprising:
a base having a display area;
a plurality of data lines disposed on the base and located in the display area; and
a plurality of columns of pixel driving circuits disposed on the base and located in the display area; a column of pixel driving circuits in the plurality of columns of pixel driving circuits being connected to a corresponding data line in the plurality of data lines, each pixel driving circuit in the column of pixel driving circuits including a driving transistor and a first transistor electrically connected to the driving transistor, the driving transistor being a P-type transistor, and the first transistor including:
a first active pattern having a first channel region, and a first doped region and a second doped region that are located on two opposite sides of the first channel region;
a first gate, an orthographic projection of the first gate on the base overlapping with an orthographic projection of the first channel region on the base; and
a first insulating block disposed on a side of the first active pattern away from the base, the first insulating block being a portion of an insulating layer located in a region where the first transistor is located, and the first insulating block having a first via; the data line being electrically connected to a portion of the first active pattern located in the first doped region through the first via;
wherein sizes of all first vias in the column of pixel driving circuits gradually decrease in a first direction, and the first direction is a direction where a signal input terminal of the data line points to a distal end opposite to the signal input terminal.

2. The display substrate according to claim 1, wherein the column of pixel driving circuits is divided into a plurality of groups of pixel driving circuits, each group of pixel driving circuits includes a plurality of pixel driving circuits, sizes of all first vias in the group of pixel driving circuits are the same, and sizes of first vias in different groups of pixel driving circuits are different.

3. The display substrate according to claim 1, further comprising:
a plurality of first voltage lines disposed on the base and located in the display area; the plurality of first voltage lines all extending in the first direction; and the plurality of first voltage lines and the plurality of data lines being disposed in a same layer; wherein
the pixel driving circuit further includes a second transistor, and the second transistor includes:
a second active pattern having a second channel region, and a third doped region and a fourth doped region that are located on two opposite sides of the second channel region; and a portion of the second active pattern located in the fourth doped region and a portion of the first active pattern located in the second doped region being connected as a whole;
a second gate, an orthographic projection of the second gate on the base overlapping with an orthographic projection of the second channel region on the base; and
a second insulating block, the second insulating block being a portion of the insulating layer in a region where the second transistor is located, and the second insulating block having a second via; a first voltage line connected to the column of pixel driving circuits being electrically connected to a portion of the second active pattern located in the third doped region through the second via;
wherein sizes of all second vias in the column of pixel driving circuits gradually increase in the first direction.

4. The display substrate according to claim 3, wherein the column of pixel driving circuits is divided into a plurality of groups of pixel driving circuits, each group of pixel driving circuits includes a plurality of pixel driving circuits, sizes of all second vias in the group of pixel driving circuits are the same, and sizes of second vias in different groups of pixel driving circuits are different.

5. The display substrate according to claim 3, wherein the pixel driving circuit further includes a storage capacitor;
the storage capacitor includes:
a first storage electrode;
a second storage electrode disposed between the first storage electrode and a layer where the plurality of data lines and the plurality of first voltage lines are located; and
the driving transistor includes:
a third active pattern having a third channel region, and a fifth doped region and a sixth doped region that are located on two opposite sides of the third channel region; and a portion of the third active pattern located in the fifth doped region and the portion of the first active pattern located in the second doped region being connected as a whole; and
a third gate further used as the first storage electrode, an orthographic projection of the third gate on the base overlapping with an orthographic projection of the third channel region on the base;
wherein the insulating layer includes a first insulating sub-layer, a second insulating sub-layer, and a third insulating sub-layer that are sequentially stacked, the first insulating sub-layer is located between the third active pattern and the first storage electrode, the second insulating sub-layer is located between the first storage electrode and the second storage electrode, and the third insulating sub-layer is located between the second storage electrode and the layer where the plurality of data lines and the plurality of first voltage lines are located; the first voltage line is electrically connected to the second storage electrode through a third via penetrating the third insulating sub-layer.

6. The display substrate according to claim 5, wherein the pixel driving circuit further includes:
a fourth transistor, the fourth transistor including:
a fourth active pattern having a fourth channel region, and a seventh doped region and an eighth doped region that are located on two opposite sides of the fourth channel region; and a portion of the fourth active pattern located in the seventh doped region and a portion of the third active pattern located in the sixth doped region being connected as a whole;
a fourth gate, an orthographic projection of the fourth gate on the base overlapping with an orthographic projection of the fourth channel region on the base; and
a fourth insulating block, the fourth insulating block being a portion of the insulating layer in a region where the fourth transistor is located, and the fourth insulating block having a fourth via; and
a first auxiliary pattern disposed in a same layer as the plurality of data lines and the plurality of first voltage lines; the first auxiliary pattern being electrically connected to a portion of the fourth active pattern located in the eighth doped region through the fourth via;
wherein sizes of all fourth vias in the column of pixel driving circuits gradually increase in the first direction.

7. The display substrate according to claim 6, wherein the column of pixel driving circuits is divided into a plurality of groups of pixel driving circuits, each group of pixel driving circuits includes a plurality of pixel driving circuits, sizes of all fourth vias in the group of pixel driving circuits are the same, and sizes of fourth vias in different groups of pixel driving circuits are different.

8. The display substrate according to claim 6, further comprising:
a plurality of enable signal lines disposed on the base and located in the display area; the plurality of enable signal lines all extending in a second direction, and the second direction intersecting with the first direction; the plurality of enable signal lines and the first storage electrode being disposed in a same layer; and each enable signal line being connected to a row of pixel driving circuit in a plurality of rows of pixel driving circuits, and a portion, located in a region where the fourth transistor is located, of an enable signal line connected to the pixel driving circuit and a portion, located in a region where a second transistor is located, of the enable signal line connected to the pixel driving circuit being used as the fourth gate and the second gate, respectively.

9. The display substrate according to claim 7, wherein the pixel driving circuit further includes:
at least one fifth transistor, each fifth transistor including:
a fifth active pattern having a fifth channel region, and a ninth doped region and a tenth doped region that are located on two opposite sides of the fifth channel region; and
a fifth gate, an orthographic projection of the fifth gate on the base overlapping with an orthographic projection of the fifth channel region on the base;
wherein a portion of the fifth active pattern in the at least one fifth transistor located in the ninth doped region and a portion of the third active pattern located in the driving transistor located in the sixth doped region are connected as a whole; and a second auxiliary pattern disposed in a same layer as the first auxiliary pattern; the second auxiliary pattern being electrically connected to the first storage electrode through a fifth via penetrating the third insulating sub-layer and the second insulating sub-layer, and being electrically connected to a portion of the fifth active pattern located in the tenth doped region through a sixth via penetrating the insulating layer.

10. The display substrate according to claim 9, further comprising:

a plurality of gate lines disposed on the base and located in the display area; the plurality of gate lines all extending in a second direction, and the second direction intersecting with the first direction; the plurality of gate lines and a plurality of enable signal lines being disposed in a same layer; and each gate line being connected to one of a plurality of rows of pixel driving circuits, and a portion, located in a region where the first transistor is located, of a gate line connected to the pixel driving circuit and a portion, located in a region where the fifth transistor is located, of the gate line connected to the pixel driving circuit being used as the first gate and the fifth gate, respectively.

11. The display substrate according to claim 9, further comprising:

a plurality of initialization signal lines disposed on the base and located in the display area; the plurality of initialization signal lines all extending in a second direction, and the second direction intersecting with the first direction; the plurality of initialization signal lines and the second storage electrode being disposed in a same layer; and each initialization signal line being connected to one of a plurality of rows of pixel driving circuits; wherein the pixel driving circuit further includes:

at least one sixth transistor, each sixth transistor including:

a sixth active pattern having a sixth channel region, and an eleventh doped region and a twelfth doped region that are located on two opposite sides of the sixth channel region; and a sixth gate, an orthographic projection of the sixth gate on the base overlapping with an orthographic projection of the sixth channel region on the base;

wherein a portion of the sixth active pattern in the at least one sixth transistor located in the twelfth doped region and the portion of the fifth active pattern in the at least one fifth transistor located in the tenth doped region are connected as a whole; and a third auxiliary pattern disposed in a same layer as the first auxiliary pattern; the third auxiliary pattern being electrically connected to an initialization signal line corresponding to the pixel driving circuit through a seventh via penetrating the third insulating sub-layer, and being electrically connected to a portion of the sixth active pattern in the at least one sixth transistor located in the eleventh doped region through an eighth via penetrating the insulating layer.

12. The display substrate according to claim 11, wherein the pixel driving circuit further includes:

a seventh transistor including:

a seventh active pattern having a seventh channel region, and a thirteenth doped region and a fourteenth doped region that are located on two opposite sides of the seventh channel region; and a portion of the seventh active pattern located in the fourteenth doped region and a portion of the fourth active pattern located in the eighth doped region being connected as a whole; and a seventh gate, an orthographic projection of the seventh gate on the base overlapping with an orthographic projection of the seventh channel region on the base; and a fourth auxiliary pattern disposed in a same layer as the third auxiliary pattern; the fourth auxiliary pattern being electrically connected to a portion of the seventh active pattern located in the thirteenth doped region through a ninth via penetrating the insulating layer, and being electrically connected to an initialization signal line corresponding to a next row of pixel driving circuits adjacent to the pixel driving circuit through a tenth via penetrating the third insulating sub-layer.

13. The display substrate according to claim 12, further comprising:

a plurality of reset signal lines disposed on the base and located in the display area; the plurality of reset signal lines all extending in the second direction, and the plurality of reset signal lines and a plurality of gate lines being disposed in a same layer; and a portion, located in a region where the sixth transistor is located, of a reset signal line connected to the pixel driving circuit being used as the sixth gate, and a portion, located in a region where the seventh transistor is located, of a reset signal line connected to the next row of pixel driving circuits adjacent to the pixel driving circuit being used as a seventh gate.

14. The display substrate according to claim 1, further comprising:

a plurality of light-emitting devices disposed on the base; each pixel driving circuit being electrically connected to one of the plurality of light-emitting devices, and the pixel driving circuit being configured to drive the light-emitting device to emit light.

15. The display substrate according to claim 14, further comprising:

a planarization layer disposed between the pixel driving circuits and the light-emitting devices; the planarization layer having a plurality of eleventh vias; wherein the pixel driving circuit includes a fourth transistor and a first auxiliary pattern; and the light-emitting device includes an anode, a light-emitting functional layer, and a cathode that are sequentially stacked in a thickness direction of the base, and the anode of the light-emitting device is electrically connected to the first auxiliary pattern through at least one eleventh via;

wherein sizes of all eleventh vias in the column of pixel driving circuits gradually increase in the first direction.

16. The display substrate according to claim 15, wherein the column of pixel driving circuits is divided into a plurality of groups of pixel driving circuits, each group of pixel driving circuits includes a plurality of pixel driving circuits, sizes of all eleventh vias in the group of pixel driving circuits are the same, and sizes of eleventh vias in different groups of pixel driving circuits are different.

17. The display substrate according to claim 15, further comprising:

a pixel defining layer disposed on a side of the anode away from the base; the pixel defining layer having a plurality of openings, and each light-emitting functional layer being disposed in a corresponding opening;

wherein sizes of all openings in the column of pixel driving circuits gradually increase in the first direction.

18. The display substrate according to claim 17, wherein the plurality of light-emitting devices include a plurality of red light-emitting devices, a plurality of green light-emitting devices, and a plurality of blue light-emitting devices, and sizes of openings corresponding to light-emitting devices of different colors are different.

19. A display panel, comprising the display substrate according to claim 1 and an encapsulation layer that is disposed on a side of the display substrate.

20. A display apparatus, comprising the display panel according to claim 19 and a data driver chip disposed on a side of the display panel, and the side where the data driver chip is located being a side where a signal input terminal of a data line in the display panel is located.

* * * * *